(12) United States Patent
Choi et al.

(10) Patent No.: US 12,535,191 B2
(45) Date of Patent: Jan. 27, 2026

(54) LED MODULE AND LIGHTING APPARATUS

(71) Applicant: SAMSUNG ELECTRONICS CO., LTD., Suwon-si (KR)

(72) Inventors: Sungwoo Choi, Suwon-si (KR); Seongmin Kim, Seongnam-si (KR); Jeongeun Yun, Hwaseong-si (KR); Chohui Kim, Hwaseong-si (KR); Seulgee Lee, Suwon-si (KR); Jeongrok Oh, Suwon-si (KR); Chulsoo Yoon, Hwaseong-si (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 323 days.

(21) Appl. No.: 18/158,207

(22) Filed: Jan. 23, 2023

(65) Prior Publication Data

US 2023/0160545 A1 May 25, 2023

Related U.S. Application Data

(63) Continuation of application No. 17/533,689, filed on Nov. 23, 2021, now Pat. No. 11,560,986.

(30) Foreign Application Priority Data

Dec. 28, 2020 (KR) .................. 10-2020-0185083

(51) Int. Cl.
*F21K 9/64* (2016.01)
*H01L 25/075* (2006.01)
(Continued)

(52) U.S. Cl.
CPC ............ *F21K 9/64* (2016.08); *H01L 25/0753* (2013.01); *H10H 20/8513* (2025.01); *F21Y 2113/30* (2023.05); *F21Y 2115/10* (2016.08)

(58) Field of Classification Search
CPC ......... F21K 9/64; F21K 9/00; H01L 25/0753; H10H 20/8513; H10H 20/812;
(Continued)

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

CN        111423881 A  *  7/2020
DE   10 2019 102 508 A1     8/2020
(Continued)

OTHER PUBLICATIONS

You et al., CN111423881A, machine translation Jul. 2020 (Year: 2020).*

(Continued)

*Primary Examiner* — Tracie Y Green
(74) *Attorney, Agent, or Firm* — Sughrue Mion, PLLC

(57) ABSTRACT

A light emitting diode (LED) module that is configured to emit white light is provided. The LED module includes: a blue light emitting diode configured to emit blue light having a first peak wavelength of 420 nm to 465 nm; and a near-infrared wavelength conversion material that is configured to be excited by the blue light to emit additional light having a peak wavelength in a range of 740 nm to 900 nm, and further having a full width at half maximum (FWHM) of 120 nm or less. The near-infrared wavelength conversion material includes $Ca(Al_{12-x-y},Ga_y)O_{19}:xCr^{3+}$ ($0 \leq x \leq 1$, $0 \leq y \leq 6$).

19 Claims, 13 Drawing Sheets

(51) Int. Cl.
*H01L 33/50* (2010.01)
*H10H 20/851* (2025.01)
*F21Y 113/00* (2016.01)
*F21Y 115/10* (2016.01)

(58) Field of Classification Search
CPC .............. F21Y 2113/30; F21Y 2115/10; F21Y 2105/18; H10D 84/8316; H10D 62/177; H10D 30/509; H10D 89/601; H10D 30/0295; A61K 40/452; A61K 40/405; B65D 83/53; F21V 9/20; F21V 23/003
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,646,685 B2 | 5/2020 | Rea et al. |
| 2006/0038198 A1 | 2/2006 | Chua et al. |
| 2010/0320480 A1 | 12/2010 | Rapoport et al. |
| 2016/0151012 A1 | 6/2016 | Bozkurt et al. |
| 2016/0364858 A1 | 12/2016 | Butte et al. |
| 2016/0369955 A1 | 12/2016 | Kahl et al. |
| 2019/0233723 A1 | 8/2019 | Lee et al. |
| 2019/0319175 A1 | 10/2019 | Chang et al. |
| 2020/0017704 A1 | 1/2020 | Yang et al. |
| 2020/0048549 A1 | 2/2020 | Hong |
| 2020/0079995 A1 | 3/2020 | Suzuki |
| 2020/0274323 A1 | 8/2020 | Onuma et al. |
| 2020/0326277 A1 | 10/2020 | Schmidt |
| 2021/0249569 A1* | 8/2021 | Fukuda ................ C09K 11/584 |
| 2021/0381954 A1* | 12/2021 | Kawamura ......... H01L 25/0753 |
| 2022/0105358 A1 | 4/2022 | Wilm et al. |
| 2022/0173282 A1* | 6/2022 | Liu .................. C09K 11/77348 |
| 2022/0205599 A1* | 6/2022 | Choi .......................... F21K 9/00 |
| 2024/0290917 A1* | 8/2024 | Won ................... H10H 20/8506 |

FOREIGN PATENT DOCUMENTS

| | | |
|---|---|---|
| JP | 2015-211150 A | 11/2015 |
| KR | 10-2009-0055891 A | 6/2009 |
| KR | 10-1345583 B1 | 12/2013 |
| KR | 10-2014-0000090 A | 1/2014 |
| KR | 10-2020-0036116 A | 4/2020 |
| KR | 10-2121266 B1 | 6/2020 |
| WO | 2010/147925 A2 | 12/2010 |
| WO | 2014/054290 A1 | 10/2014 |
| WO | 2018/207703 A1 | 11/2018 |
| WO | 2020/010899 A1 | 1/2020 |
| WO | 2020/100473 A1 | 5/2020 |
| WO | 2020/107425 A1 | 6/2020 |

OTHER PUBLICATIONS

Communication issued Nov. 21, 2024, issued by the German Patent and Trademark Office in German Application No. 10 2021 006 403.8.
"Circadian rhythm", Wikipedia, 2024, https://en.wikipedia.org/w/index.php?title=Circadian_rhythm&oldid, pp. 1-28 (28 pages total).
Office Action dated Oct. 9, 2023, issued by German Patent Office in German Patent Application No. 10 2021 006 403.8.
English Translation of JP2015211150A; Okada et al. (Year: 2015).
English Translation of WO2014054290A1; Katsutoshi; (Year: 2014).
English Translation of WO-2020100473-AI; Adachi et al.; May 2020.
English Translation of WO-2020010899-AI; Cai et al. ; Jan. 2020.
Communication dated Oct. 9, 2025, issued by the German Patent Office in counterpart German Application No. 102021006403.8.
"Sialon". In: Wikipedia, The Free Encyclopedia, editing status: Jun. 7, 2020, 09:02 UTC. URL: https://en.wikipedia.org/wiki/Sialon [accessed on Oct. 8, 2025], Total 3 pages.

* cited by examiner

100C

I - I'

LED MODULE AND LIGHTING APPARATUS

CROSS-REFERENCE TO THE RELATED APPLICATION

This application is a Continuation of U.S. application Ser. No. 17/533,689, filed on Nov. 23, 2021, which claims benefit of Korean Patent Application No. 10-2020-0185083, filed on Dec. 28, 2020, in the Korean Intellectual Property Office, the disclosures of which are incorporated herein by reference in their entireties.

BACKGROUND

1. Field

Embodiments of the present disclosure relate to a light emitting diode (LED) module and a lighting apparatus.

2. Description of Related Art

In general, an LED lighting apparatus may include an LED module including at least one LED chip emitting light of a specific wavelength.

In particular, an LED lighting apparatus (e.g., a white lighting apparatus) may be configured to emit white light. For example, a white lighting apparatus using LEDs may include LED chips of various wavelengths, or may include an LED module in which a wavelength conversion material such as a phosphor is combined with at least one LED chip.

In recent years, life (or human)-friendly lighting in consideration of biological effects on humans and living organisms, as well as conventional lighting functions, has been required.

SUMMARY

An aspect of the present disclosure is to provide an LED module and a lighting apparatus having a photobiomodulation function.

According to one or more embodiments, a light emitting diode (LED) module is provided. The LED module includes: a blue light emitting diode configured to emit blue light having a first peak wavelength of 420 nm to 465 nm; and a near-infrared wavelength conversion material that is configured to be excited by the blue light to emit additional light having a peak wavelength in a range of 740 nm to 900 nm, and further having a full width at half maximum (FWHM) of 120 nm or less, wherein the near-infrared wavelength conversion material includes $Ca(Al_{12-x-y},Ga_y)O_{19}:xCr^{3+}$ ($0 \leq x \leq 1$, $0 \leq y \leq 6$).

According to one or more embodiments, a light emitting diode (LED) module is provided. The LED module includes: a blue light emitting diode configured to emit blue light having a first peak wavelength of 420 nm to 465 nm; at least one wavelength conversion material that is configured to convert a portion of the blue light into first light having a first peak wavelength in a visible light wavelength band; and a near-infrared wavelength conversion material that is configured to be excited by the blue light to emit second light having a second peak wavelength in a range of 740 nm to 900 nm, and further having a full width at half maximum (FWHM) of 120 nm or less, wherein the near-infrared wavelength conversion material includes $Ca(Al_{12-x-y},Ga_y)O_{19}:xCr^{3+}$ ($0 \leq x \leq 1$, $0 \leq y \leq 6$), and wherein the first light, second light, and another portion of the blue light combine to form colored light in the visible light wavelength band.

According to one or more embodiments, a light emitting diode (LED) module is provided. The LED module includes: a blue light emitting diode configured to emit blue light having a first peak wavelength of 420 nm to 465 nm; and a near-infrared wavelength conversion material that is configured to be excited by the blue light to emit additional light having a peak wavelength in a range of 740 nm to 900 nm, and further having a full width at half maximum (FWHM) of 120 nm or less, wherein in a spectrum of light emitted from the LED module, wherein an integrated light amount of a visible light wavelength band of 700 nm or less is 20% or less of an integrated light amount of an entirety of the spectrum, and wherein the near-infrared wavelength conversion material includes at least one phosphor selected from a group consisting of $Ca(Al_{12-x-y},Ga_y)O_{19}:xCr^{3+}$ ($0 \leq x \leq 1$, $0 \leq y \leq 6$), $Lu_3Al_5O_{12}:Ce^{3+}$, $Cr^{3+}$, $La_3MgZrO_6:Cr^{3+}$, $LiInSi_2O_6:Cr^{3+}$, $LiZnSnO:Cr^{3+}$, and $ScBO_3:Cr^{3+}$.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
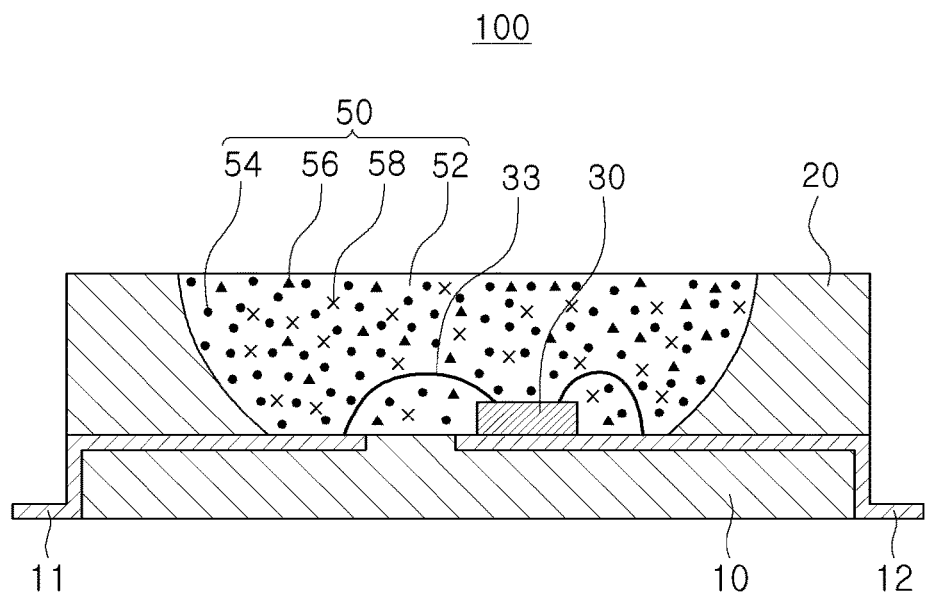
FIG. 1 is a schematic cross-sectional view illustrating an LED module according to an example embodiment of the present disclosure.

FIG. 1 is a schematic cross-sectional view illustrating an LED module according to an example embodiment of the present disclosure.

Referring to FIG. 1, an LED module 100 according to the present example embodiment may include a package substrate 10, a light emitting diode (LED) 30 disposed on the package substrate 10, and a wavelength conversion unit 50. The LED module 100 may further include a pair of lead frames 11 and 12 electrically connected to the LED 30, a side wall reflecting unit 20 having a cup shape, and a conductive wire 33 connecting the LED 30 (e.g., a blue LED) and the lead frames 11 and 12. In this specification, the term "LED module" is used to include "LED package".

In some example embodiments, the package substrate 10 may be formed of an opaque resin or a resin having high reflectivity. For example, the package substrate 10 may also include a resin containing high-reflective powder (e.g., $TiO_2$). In some example embodiments, the package substrate 10 may be made of a ceramic allowing heat to be easily radiated. In some example embodiments, the package substrate 10 may be a printed circuit board having a wiring pattern replacing the lead frames 11 and 12.

The side wall reflecting unit 20 may be disposed on the package substrate 10 and the lead frames 11 and 12 and may have a cavity for accommodating the LED 30. The side wall reflecting unit 20 may have a cup shape to improve a reflective efficiency of light, but is not limited thereto. In some example embodiments, the side wall reflecting unit 20 may also be integrally formed with the package substrate 10. For example, the side wall reflecting unit 20 and the package substrate 10 may be formed of the same material (e.g., a resin containing highly reflective powder) through the same process (e.g., injection molding).

The LED module 100 according to the present example embodiment may be an LED module configured to emit white light.

The LED 30 may be a blue LED including an epitaxial semiconductor layer configured to emit blue light. Blue light emitted from the LED 30 may have a peak wavelength in a range of 420 nm to 465 nm. In some example embodiments, the blue light may have a peak wavelength in a range of 430 nm to 455 nm.

The wavelength conversion unit 50 may be disposed on an optical path of the LED 30, and may include a plurality of wavelength conversion materials dispersed in a transparent resin 52. The plurality of wavelength conversion materials may include first to third wavelength conversion materials 54, 56, and 58 excited by blue light generated from the LED 30 to emit light having different wavelengths. For example, the transparent resin 52 may be made of epoxy, silicon, modified silicone, a urethane resin, an oxetane resin, acrylic, polycarbonate, polyimide, and combinations thereof. In some example embodiments, instead of dispersing the first to third wavelength conversion materials 54, 56, and 58 in the transparent resin 52, the transparent resin 52 may be applied directly to a surface of the LED 30 (referring to first LED light source 100' in FIG. 15).

The first wavelength conversion material 54 and the second wavelength conversion material 56 employed in the present example embodiment may be configured to emit first and second lights of different colors in a visible light wavelength band, respectively. The first and second light may be combined with an unconverted blue light unit to emit desired white light. In some example embodiments, a peak wavelength of the first light may range from 520 nm to 560 nm, and a peak wavelength of the second light may range from 600 nm to 660 nm. For example, the first wavelength conversion material 54 may include $(Ga,Gd,Y,Lu)_3Al_5O_{12}$:$Ce^{3+}$, $La_3Si_6N_{11}$:$Ce^{3+}$, $(Sr,Ca,Ba)Si_2O_2N_2$:$Eu^{2+}$, $(Sr,Ba)_2SiO_4$:$Eu^{2+}$, β-SiAlON:$Eu^{2+}$ or a combination thereof. The second wavelength conversion material 56 may include $(Sr,Ca)AlSiN_3$:$Eu^{2+}$, $CaAlSiN_3$:$Eu^{2+}$, $K_xSiF_y$:$Mn^{4+}$ ($2 \leq x \leq 3$, $4 \leq y \leq 7$)(hereinafter, referred to as KSF) or a combination thereof.

The thus obtained white light has a color rendering index (CRI) of 70 or more, and a wavelength conversion material and a blending ratio thereof can be appropriately selected to have an appropriate color temperature. In some example embodiments, the color temperature (CCT) of the white light may be designed in a range of 1800 to 6500K.

A third wavelength conversion material (e.g., wavelength conversion material 58) employed in the present example embodiment may be configured to emit light in a near-infrared band. Light in the near-infrared band may have a peak wavelength of 740 nm to 900 nm. In some example embodiments, light in the near-infrared band may have a peak wavelength of 750 nm to 850 nm. In some example embodiments, light in the near-infrared band may have a full width at half maximum (FWHM) of 120 nm or less.

Figure 2A:
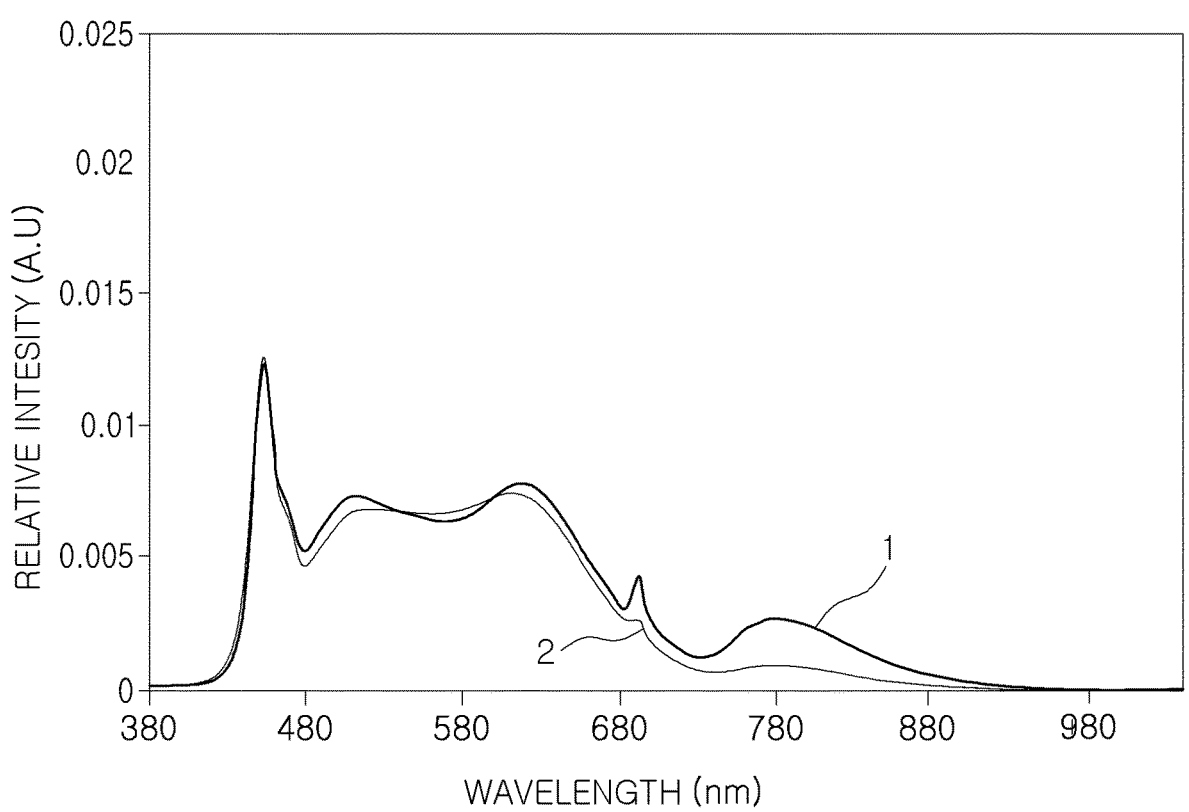
FIG. 2A illustrates an emission spectrum of white light emitted from an LED module according to an example embodiment of the present disclosure.

FIG. 2A illustrates an emission spectrum of white light emitted from an LED module according to an example embodiment of the present disclosure.

Referring to FIG. 2A, a spectrum 2 of white light emitted from an LED module similar to the LED module 100 shown in FIG. 1 is shown. Specifically, the LED module according to the present example embodiment may include a blue LED chip having a peak wavelength of 448 nm, and have a structure employing a $CaAl_{12-x}O_{19}$:$xCr^{3+}$ ($0 \leq x \leq 1$) phosphor (see FIG. 5) as a third wavelength conversion material for near-infrared light, together with $(Ga,Gd,Y,Lu)_3Al_5O_{12}$:$Ce^{3+}$, and $CaAlSiN_3$:$Eu^{2+}$, respectively, as first and second wavelength conversion materials. On the other hand, a spectrum 2 represents a spectrum of white light emitted from the LED module in which only the third wavelength conversion material is omitted in the above-described LED module 100.

In the spectrum 1 of white light according to the present example embodiment, a peak intensity between 740 nm and 900 nm may be 4.5% or more of a peak intensity in a blue band (e.g., 420 nm to 465 nm), and in some example embodiments, it may be 7% or more.

In the spectrum 1 of white light, the intensity of a near-infrared band may be increased by the wavelength conversion material 58. An increase in light in the near-infrared band according to the present example embodiment can be represented by an integrated amount of light of 750 nm to 850 nm. An integrated light amount of 750 nm to 850 nm according to the present example embodiment may be increased by at least 1.3 times compared to an integrated light amount of 750 nm to 850 nm before the wavelength conversion material 58 is applied. In some example embodiments, the amount of integrated light of 750 nm to 850 nm may be increased by two times or more.

As described above, in the present example embodiment, the wavelength conversion material 58 can provide a positive biological effect such as promoting ATP generation by increasing the intensity of the band of 740 nm to 900 nm in white light.

In some example embodiments, light may have a high intensity in a band of 740 nm to 900 nm, slightly spaced apart from the visible light wavelength band by the wavelength conversion material 58 in consideration of a biological enhancement efficiency. As shown in FIG. 2A, the spectrum 1 of white light according to the present example embodiment may have at least one valley between adjacent peak wavelengths in a visible light wavelength band.

Meanwhile, a part of the light emitted from the LED 30 is excited by the wavelength conversion material 58 to convert a wavelength, so that it may be slightly lower than that of the visible light wavelength band of the spectrum 2 of white light. As described above, illuminance of illumination light (e.g., white light) may be slightly lowered by the wavelength conversion material 58.

Figure 2B:
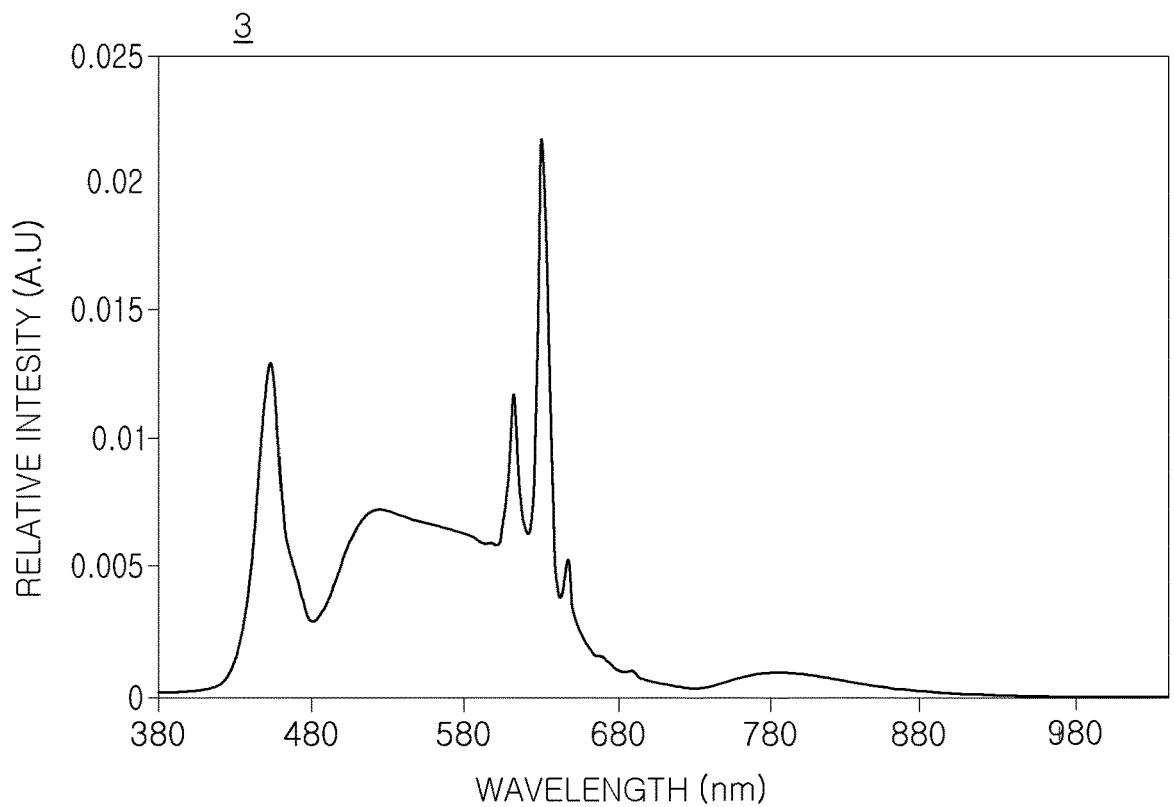
FIG. 2B illustrates an emission spectrum of white light emitted from an LED module according to an example embodiment of the present disclosure.

FIG. 2B illustrates a spectrum 3 of an example in which $CaAlSiN_3:Eu^{2+}$ used as a second wavelength conversion material (red phosphor) is used as a KSF phosphor in the LED module according to the present example embodiment employed in FIG. 2A.

Referring to FIG. 2B, similar to the spectrum of the previous example embodiment, since a $CaAl_{12-x}O_{19}:xCr^{3+}$ ($0 \leq x \leq 1$) phosphor, a near-infrared wavelength conversion material, is introduced in a wavelength band of 740 nm to 900 nm (e.g., 785 nm), it is possible to provide an effect of promoting ATP generation by increasing the intensity of a wavelength band of 740 nm to 900 nm (e.g., a peak wavelength of 785 nm).

Hereinafter, a wavelength condition of the near-infrared ray required in the present disclosure will be described in detail, together with a positive biological-effect using reinforcement of the near-infrared band.

In general, it is known that light in the near-infrared band is absorbed by cytochrome c oxidase present in an inner mitochondrial membrane to promote generation of ATP (Adenosine Triphosphate), which is a source of energy in cells.

Figure 3A:
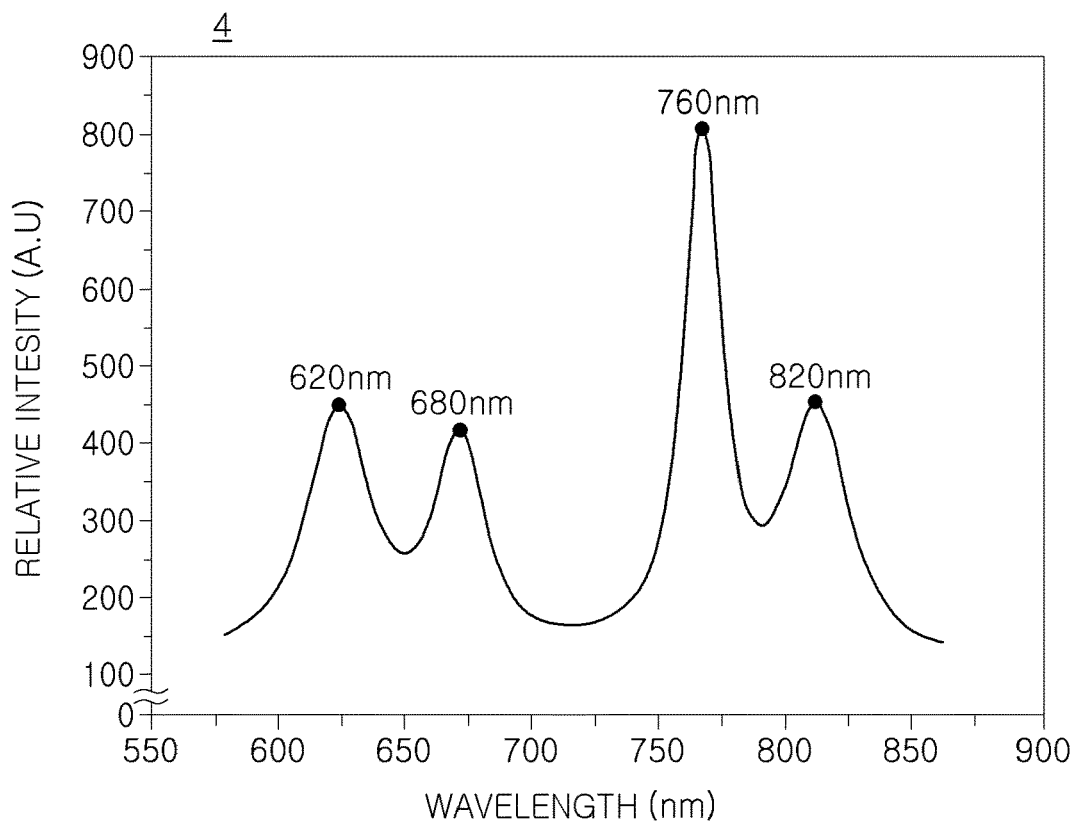
FIG. 3A illustrates an action spectrum for stimulating a speed of DNA synthesis in cells.

An action spectrum 4 for stimulating a rate of DNA synthesis in cells can be expressed using absorbing chromophores of cytochrome c oxidase, as shown in FIG. 3A (see FIG. 1, by Tiina I. Karu of a thesis "Multiple Roles of Cytochrome c Oxidase" in Mammalian Cells Under Action of Red and IR-A Radiation"). Referring to FIG. 3A, this action spectrum 4 has four absorption peaks, 620 nm, 680 nm, 760 nm, and 820 nm that are meaningful in a red to near-infrared region.

Figure 3B:
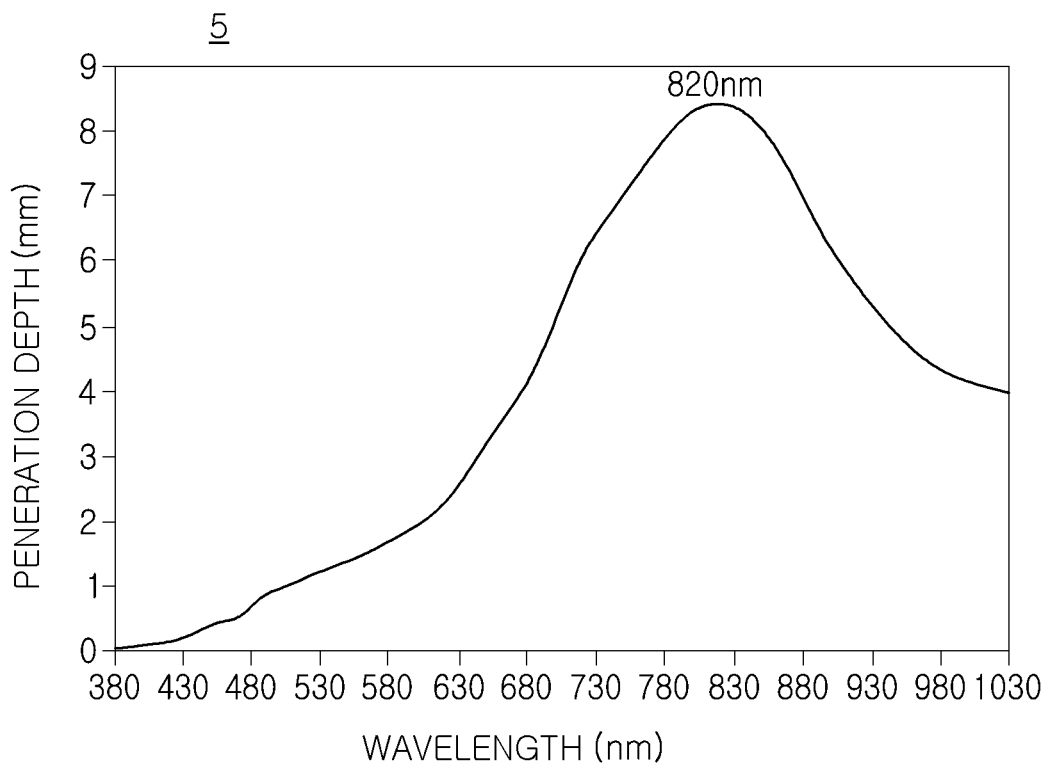
FIG. 3B is a graph illustrating skin penetration depth according to a wavelength.

Despite this action spectrum 4, a spectrum actually affecting generation of ATP may change depending on a skin transmittance rate. This skin transmittance rate may be defined by a skin penetration depth according to a wavelength. Referring to the graph 5 of FIG. 3B, the skin penetration depth according to the wavelength has a peak in a 820 nm band, is relatively high in an infrared band, but appears low in a visible light wavelength band.

Embodiments of the present disclosure include a method of defining a spectrum calculated by multiplying an action spectrum of cytochrome c oxidase (see FIG. 3A) by a skin penetration depth (see FIG. 3B) according to a wavelength as an ATP action spectrum. The ATP action spectrum of embodiments of the present disclosure is shown in FIG. 4.

Figure 4:
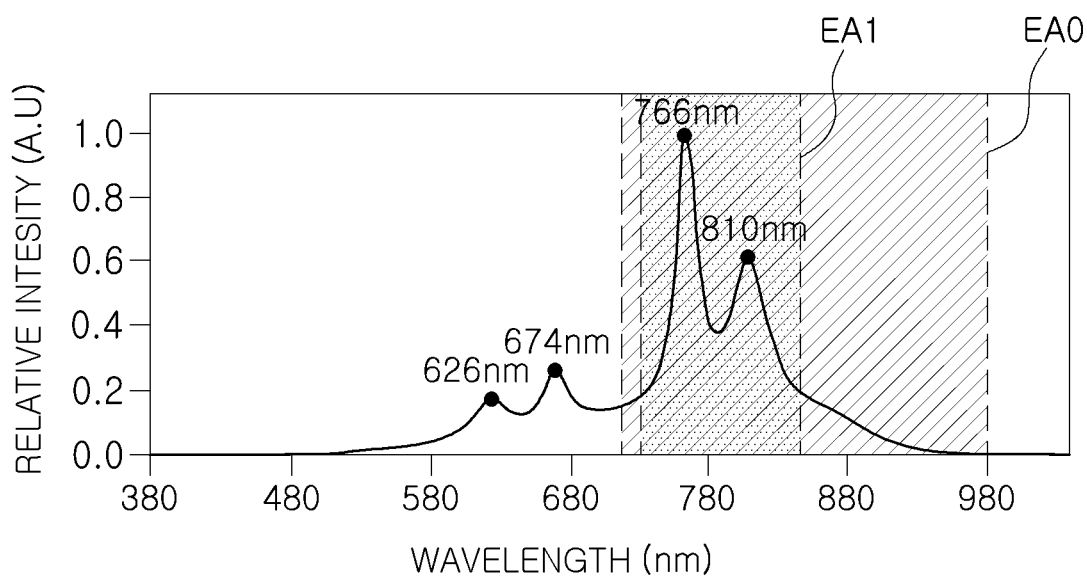
FIG. 4 illustrates the ATP action spectrum utilized in example embodiments of the present disclosure.

Referring to FIG. 4, the ATP action spectrum has a peak wavelength similar to four absorption peaks of the action spectrum of cytochrome c oxidase, but the four peaks may fluctuate to the peaks of 626 nm, 674 nm, 766 nm, and 810 nm, respectively by the skin transmittance rate. In addition, the ATP action spectrum may appear relatively low in a visible band of 626 nm and 674 nm, and may appear relatively high in a near-infrared band of 766 nm and 810 nm and a proximity band thereof.

In consideration of such practical action efficiency, an "effective ATP action bandwidth (EA)" from the ATP action spectrum shown in FIG. 4 may be defined as a near-infrared band (EOA) centered on 740 nm to 900 nm. In some example embodiments, an effective ATP action band may also be set to a range EA1 having light of a peak wavelength of 750 nm to 850 nm. This effective ATP action band (range EA0 or range EA1) may reduce an influence of basic illumination light (e.g., white light or colored light) by ATP generation promotion light according to the present disclosure by selecting the near-infrared band so that the visible light wavelength band with a low efficiency is minimized.

In the present example embodiment, the wavelength conversion material 58 introduced to promote generation of ATP may be excited by the blue light to be configured to emit third light covering the effective ATP action band EA described above. The third light may have a peak wavelength of 740 nm to 900 nm. In some example embodiments, the third light converted by the wavelength conversion material 58 may have a peak wavelength of 750 nm to 850 nm. The third light may penetrate into a human skin and is absorbed by cytochrome c oxidase in cells, thereby substantially contributing to promoting the generation of ATP, a source of energy in cells.

In the present example embodiment, a light source for providing light in the near-infrared band may be provided with a wavelength conversion material such as an inorganic phosphor and/or a quantum dot. For example, the wavelength conversion material 58 may include a $CaAl_{12-x}O_{19}:xCr^{3+}$ ($0 \leq x \leq 1$) phosphor.

Figure 5:
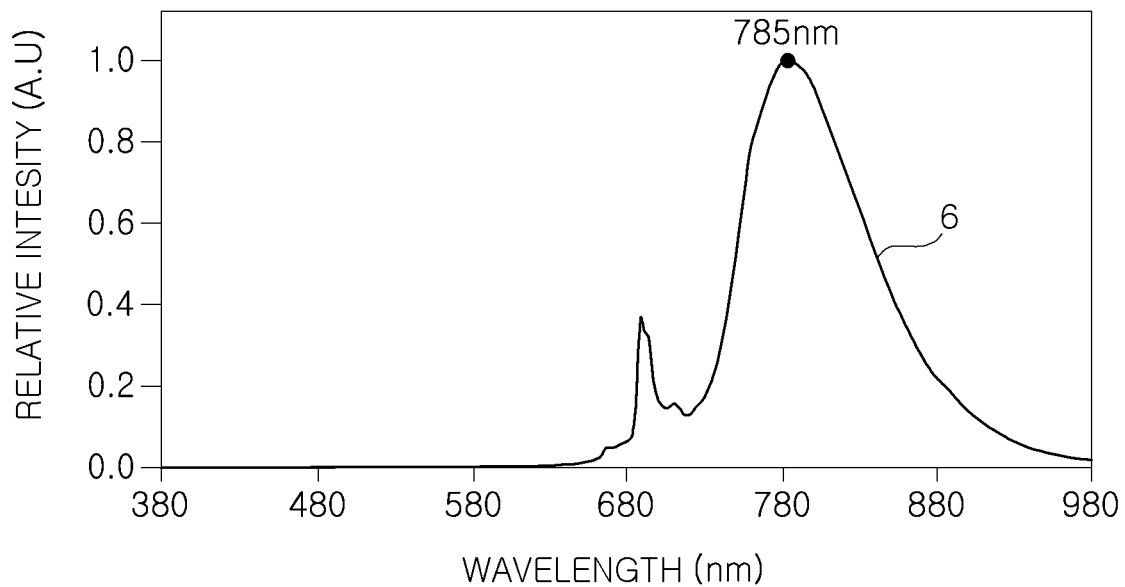
FIG. 5 is a graph illustrating an emission spectrum of a near-infrared (NIR) wavelength conversion material employable in an LED module according to an example embodiment of the present disclosure.

FIG. 5 illustrates a spectrum 6 of third light (excitation light: a peak wavelength of 448 nm) by a $CaAl_{12-x}O_{19}:xCr^{3+}$ phosphor that can be used as the wavelength conversion material 58 in the present example embodiment.

Referring to FIG. 5, a spectrum 6 of third light has a maximum peak wavelength of about 785 nm and a full width at half maximum (FWHM) of about 95 nm. Since this spectrum 6 has a high amount of light in the above-described effective ATP action band of 740 nm to 900 nm, a spectrum of white light may increase an integrated amount of light in the effective ATP action band (EA) as described with reference to FIG. 2 to affect a biological effect promoting the generation of ATP, an energy source in cells. In addition, the phosphor employed in the present example embodiment may have a sub-peak at 690 nm in the spectrum 6 of the third light.

When a wavelength conversion material 58 is used as the near-infrared light source, a part of the light emitted from the LED 30 is used as excitation light of the wavelength conversion material 58, so that the spectrum of the visible light wavelength band may be generally lowered. That is, the illuminance of illumination light (e.g., white light) may be slightly lowered by the wavelength conversion material 58.

As described above, the wavelength conversion material 58 according to the present example embodiment may be configured to emit light having a peak wavelength of 740 nm to 900 nm and a full width at half maximum. (FWHM) of 120 nm or less.

In the spectrum 6 of the third light shown in FIG. 5, in order to enhance an ATP generation promotion effect, an integrated light amount in an infrared band (700 nm or more) based on a wavelength of 700 nm may be higher than an integrated light amount in a visible light wavelength band (700 nm or less). Although not limited thereto, the integrated light amount of the visible light wavelength band of 700 nm or less may be 20% or less of the integrated light amount of the entire spectrum of the third light, and may be 10% or less in some example embodiments.

In the present example embodiment, a wavelength conversion material such as a phosphor is used as a near-infrared light source, but may include other types of phosphors. For example, in addition to a$(Al_{12-x-y},Ga_y)O_{19}$:$xCr^{3+}$ ($0≤x≤1$, $0≤y≤6$) including the phosphor of the foregoing example, $Lu_3Al_5O_{12}$:$Ce^{3+}$,$Cr^{3+}$, $La_3MgZrO_6$:$Cr^{3+}$, $LiInSi_2O_6$:$Cr^{3+}$, $LiZnSnO$:$Cr^{3+}$, $ScBO_3$:$Cr^3$, or a combination thereof may be included. In addition, the near-infrared wavelength conversion material may include quantum dots in addition to phosphors having the above-described composition. In some example embodiments, the near-infrared light source may include an LED chip (see FIGS. 10 and 11B).

Figure 6:
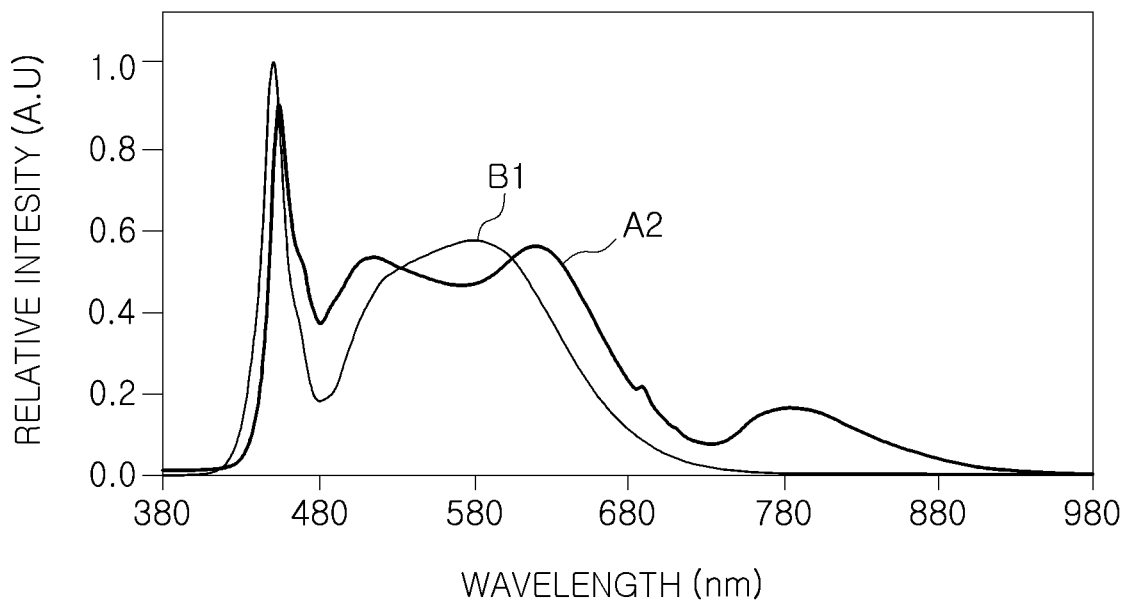
FIG. 6 illustrates emission spectra of white light emitted from LED modules according to examples and comparative examples of the present disclosure.

FIG. 6 illustrates an emission spectrum of white light emitted from an LED module according to an Example and a Comparative example.

White LED modules according to an Example and a Comparative example according to the present disclosure were manufactured. First, in the white LED module according to the Comparative example, a white LED module emitting white light having a color rendering index of 80 was manufactured by mixing green and red phosphors together with a blue LED chip having a peak wavelength of 448 nm. White light according to the Comparative example has a spectrum B1 in FIG. 6.

In contrast thereto, in the white LED module according to the present example embodiment, a white LED module having a color rendering index of 80 was manufactured similarly to the Comparative example by combining green and red phosphors with a $CaAl_{12-x}O_{19}$:$xCr^{3+}$ phosphor, which is a near-infrared light source. The white light according to the Example has a spectrum indicated by "A2" in FIG. 6.

When a region in which a white light spectrum (B1) of the Comparative example overlaps the ATP action spectrum shown in FIG. 4 (defined as a product of the two spectra) is 100, it was found that a region in which a white light spectrum (A2) of the Example overlaps the ATP action spectrum is 250. In terms of illuminance, it can be confirmed that by using a wavelength conversion material (e.g., $CaAl_{12-x}O_{19}$:$xCr^{3+}$) as a near-infrared light source, it is slightly lowered by using a part of excitation light, but effective light corresponding to the ATP action spectrum is greatly increased by 2 times or more.

Figure 7A:
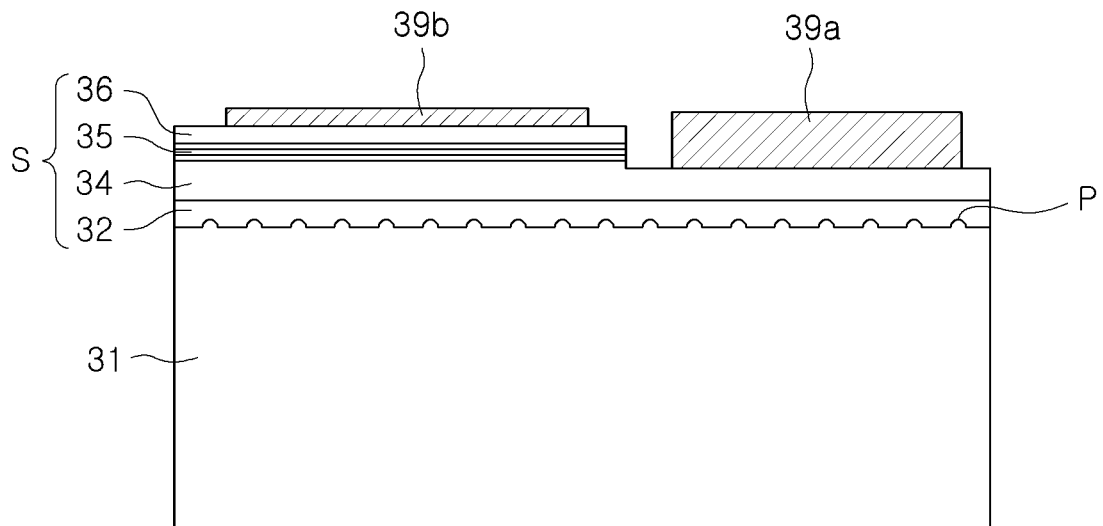
FIG. 7A is a first schematic cross-sectional view illustrating a light emitting diode chip employed in a white light emitting apparatus according to an example embodiment of the present disclosure.
Figure 7B:
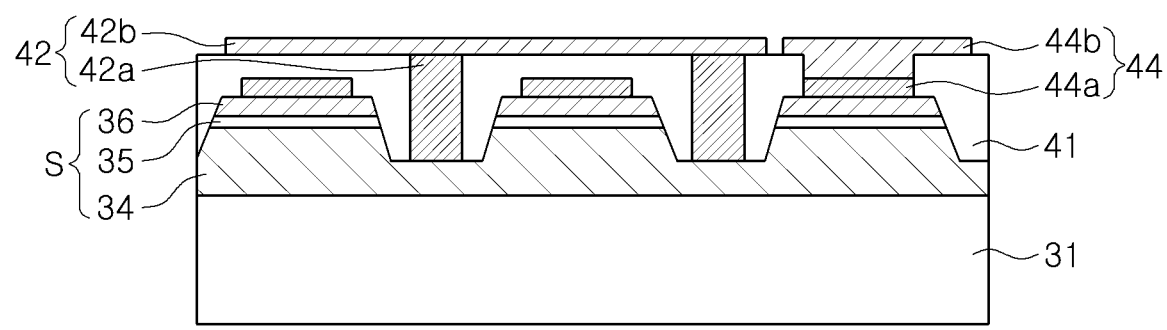
FIG. 7B is a second schematic cross-sectional view illustrating the light emitting diode chip employed in the white light emitting apparatus according to the example embodiment of the present disclosure.

FIGS. 7A and 7B are schematic cross-sectional views illustrating a light emitting chip employed in a white light emitting apparatus according to an example embodiment of the present disclosure.

Referring to FIG. 7A, an LED chip 30A employed in the present example embodiment includes a substrate 31 and a semiconductor laminate S disposed on the substrate 31. The semiconductor laminate S may include a first conductivity-type semiconductor layer 34, an active layer 35, and a second conductivity-type semiconductor layer 36 sequentially disposed on the substrate 31. A buffer layer 32 may be additionally disposed between the substrate 31 and the first conductivity-type semiconductor layer 34.

The substrate 31 may be an insulating substrate such as sapphire. However, embodiments of the present disclosure are not limited thereto, and the substrate 31 may be a conductive or semiconductor substrate in addition to having insulating properties. For example, the substrate 31 may be SiC, Si, $MgAl_2O_4$, MgO, $LiAlO_2$, $LiGaO_2$, and GaN in addition to sapphire. An unevenness P may be formed on an upper surface of the substrate 31. The unevenness P may improve a quality of a single crystal grown while improving light extraction efficiency.

The buffer layer 32 may include undoped $In_xAl_yGa_{1-x-y}N$ ($0≤x≤1$, $0≤y≤1$). For example, the buffer layer 32 may be GaN, AlN, AlGaN, or InGaN. According to embodiments, as the buffer layer 32, a plurality of layers may be combined or the composition thereof may be gradually changed.

The first conductivity-type semiconductor layer 34 may be a nitride semiconductor satisfying n-type $Al_xIn_yGa_{1-x-y}N$ ($0≤x≤1$, $0≤y≤1$, $0≤x+y≤1$), and n-type impurities may be Si. For example, the first conductivity-type semiconductor layer 34 may be n-type GaN. The second conductivity-type semiconductor layer 36 may be a nitride semiconductor layer satisfying p-type $Al_xIn_yGa_{1-x-y}N$, and p-type impurities may be Mg. For example, the second conductivity-type semiconductor layer 36 may be implemented in a single layer structure, but may have a multi-layer structure having different compositions, as in the present example embodiment.

The active layer 35 may have a multi-quantum well (MQW) structure in which a quantum well layer and a quantum barrier layer are alternately stacked. For example, the quantum well layer and the quantum barrier layer may be $In_xAl_yGa_{1-x-y}N$ ($0≤x≤1$, $0≤y≤1$, $0≤x+y≤1$) having different compositions. In a specific example, the quantum well layer may be $In_xGa_{1-x}N$ ($0≤x≤1$), and the quantum barrier layer may be GaN or AlGaN. The thicknesses of the quantum well layer and the quantum barrier layer may each range from 1 nm to 50 nm. The active layer 35 may be not limited to a multi-quantum well structure, and may be a single quantum well structure.

A first electrode 39a and a second electrode 39b may be respectively disposed on the mesa-etched region of the first conductivity-type semiconductor layer 34 and the second conductivity-type semiconductor layer 36 so as to be positioned on the same surface. The first electrode 39a is not limited thereto, and may include a material such as Ag, Ni, Al, Cr, Rh, Pd, Ir, Ru, Mg, Zn, Pt, Au, or the like, and may be employed in a single layer or two or more layers. In some example embodiments, the second electrode 39b may be a transparent electrode such as a transparent conductive oxide or a transparent conductive nitride, or may also include graphene. The second electrode 39b may include at least one of Al, Au, Cr, Ni, Ti, and Sn.

Referring to FIG. 7B, it can be understood that the LED chip 30B according to the present example embodiment is similar to the LED chip 30A shown in FIG. 7A, except for an electrode structure and a structure related thereto. For a description of the components of the present example embodiment, unless otherwise specified, reference may be made to the description of components that are the same as or similar to the LED chip 30A shown in FIG. 6A.

The LED chip 30B includes a first electrode 42 and a second electrode 44 respectively connected to the first conductivity-type semiconductor layer 34 and the second conductivity-type semiconductor layer 36. The first electrode 42 may include a connection electrode unit 42a penetrating through the second conductivity-type semiconductor layer 36 and the active layer 35 and connected to the first conductivity-type semiconductor layer 34 and a first electrode pad 42b connected to the connection electrode unit 42a. The connection electrode unit 42a may have the same structure as a conductive via. The connection electrode unit 42a may be surrounded by the insulating unit 41 to be electrically separated from the active layer 35 and the second conductivity-type semiconductor layer 36. The connection electrode unit 42a may be disposed in a region in which the semiconductor laminate S is etched. The number, shape, pitch, or contact area with the first conductivity-type semiconductor layer 34 may be appropriately designed for the connection electrode unit 42a to reduce contact resistance. In addition, the connection electrode unit 42a may be arranged on the semiconductor laminate S to form rows and columns, thereby improving current flow. The second electrode 44 may include an ohmic contact layer 44a and a second electrode pad 44b on the second conductivity-type semiconductor layer 36.

In the connection electrode unit 42a and the ohmic contact layer 44a, a conductive material having an ohmic characteristic with the first conductivity-type semiconductor layer 34 and the second conductivity-type semiconductor layer 36 may have a single-layer or multi-layer structure. For example, it may be formed by a process of depositing or sputtering at least one of metal such as Ag, Al, Ni, and Cr, and a transparent conductive oxide (TCO) such as ITO.

The first electrode pad 42b and the second electrode pad 44b may respectively be connected to the connection electrode unit 42a and the ohmic contact layer 44a to function as external terminals of the LED chip 30B. For example, the first electrode pad 42b and the second electrode pad 44b may be Au, Ag, Al, Ti, W, Cu, Sn, Ni, Pt, Cr, NiSn, TiW, AuSn, or eutectic metals thereof.

The first electrode pad 42b and the second electrode pad 44b may be disposed in the same direction as each other, and may be mounted on a lead frame, or the like in a so-called flip chip form. Meanwhile, the first electrode 42 and the second electrode 44 may be electrically separated from each other by the insulating unit 41. The insulating unit 41 may be any material having electrical insulation properties, and any material having electrical insulation properties may be used, but a material having a low light absorption rate may be used. For example, silicon oxide or silicon nitride may be used. According to embodiments, a light reflective structure may be formed by dispersing light reflective powder in a light transmissive material. Alternatively, the insulating unit 41 may have a multilayer reflective structure in which a plurality of insulating films having different refractive indices are alternately stacked. For example, the multilayer reflective structure may be a Distributed Bragg Reflector (DBR) in which a first insulating film having a first refractive index and a second insulating film having a second refractive index are alternately stacked.

In the multilayer reflective structure, a plurality of insulating films having different refractive indices may be repeatedly stacked by 2 to 100 times. For example, in the multilayer reflective structure, a plurality of insulating film may be repeatedly stacked by 3 to 70 times, and further repeatedly stacked by 4 to 50 times. Each of the plurality of insulating films of the multilayer reflective structure may be oxides or nitrides such as $SiO_2$, SiN, $SiO_xN_y$, $TiO_2$, $Si_3N_4$, $Al_2O_3$, TiN, AlN, $ZrO_2$, TiAlN, TiSiN, and combinations thereof. The refractive indexes of the first and second insulating films may be determined in a range of about 1.4 to about 2.5, and may be a value, lower than the refractive index of the first conductivity-type semiconductor layer 34 and the refractive index of the substrate 31, but may also have a value lower than the refractive index of the first conductivity-type semiconductor layer 34 and higher than the refractive index of the substrate 31. The LED chip 30A and the LED chip 30B, described above, may be used as the LED 130 (e.g., blue LED) of a white light emitting apparatus (e.g., LED module 100 or LED module 100A).

Figure 8:
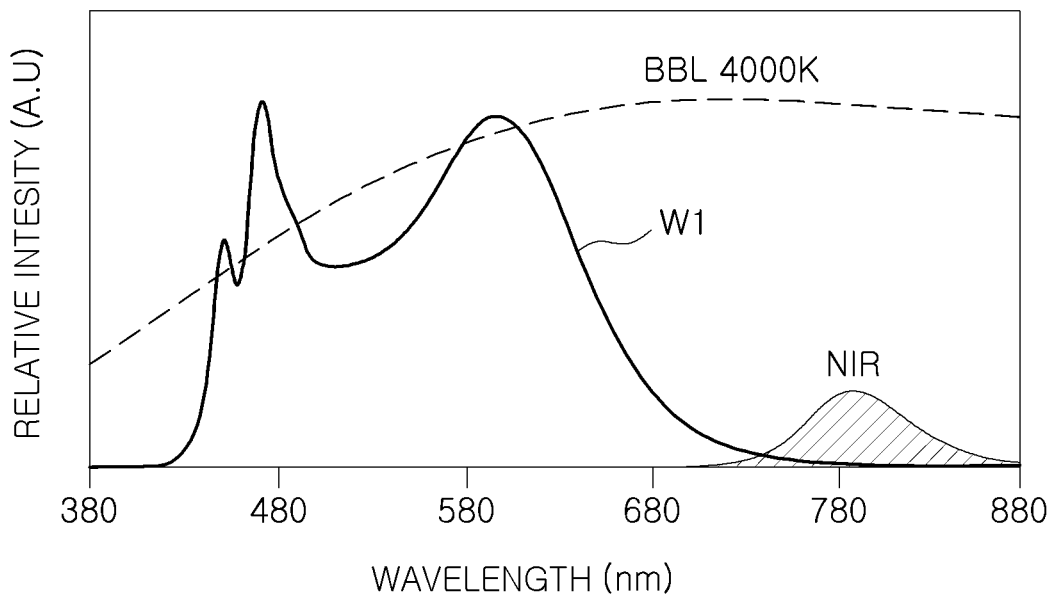
FIG. 8 illustrates an emission spectrum of white light of a white light emitting apparatus according to an example embodiment of the present disclosure.
Figure 9:
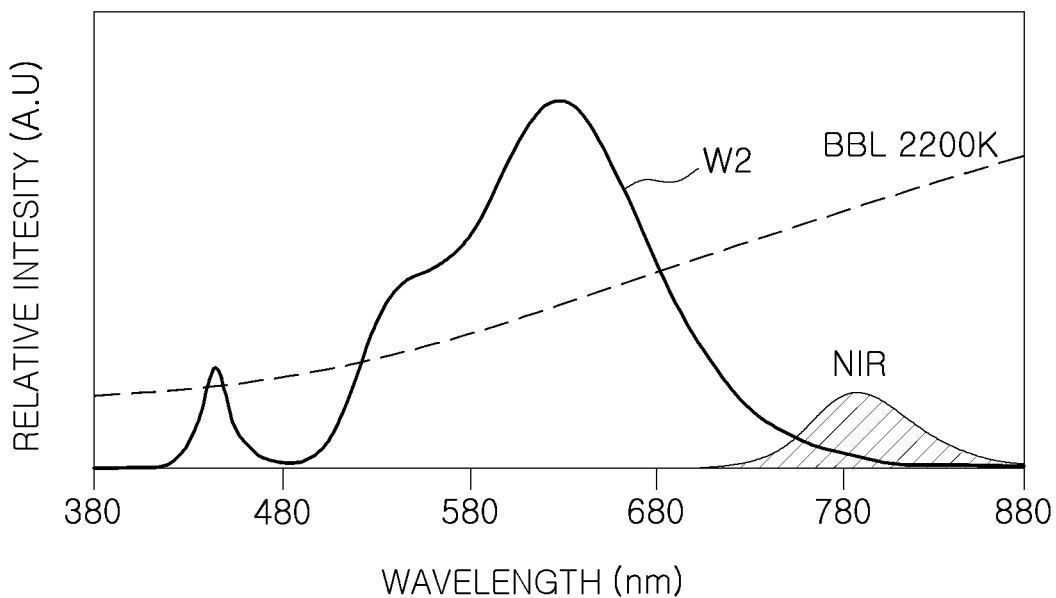
FIG. 9 illustrates an emission spectrum of white light of a white light emitting apparatus according to an example embodiment of the present disclosure.

The near-infrared light source for promoting generation of ATP according to the present disclosure can be advantageously combined with various white illumination light sources. FIGS. 8 and 9 illustrate emission spectra of white light of a white light emitting apparatus according to various example embodiments of the present disclosure.

Referring to FIG. 8, a spectrum W1 of white light to reduce a blue light hazard (BLH) by employing relatively soft second blue light together with first blue light is shown.

The white light may reduce BLH by controlling an intensity ratio of the first and second blue light, and increase a color rendering index through a combination of the first conversion material 254 and the second conversion material 256. For example, a peak intensity of the second blue light may be 50% or more compared to the peak intensity of the first blue light. For a BLH reduction effect, a peak intensity ratio of the two units of blue light may be 70% or more, and further, the peak intensity of the second blue light may be selected to be greater than the peak intensity of the first blue light.

As shown in FIG. 8, by adding a near-infrared light source (NIR) having a peak intensity of 740 nm to 900 nm, a positive bio-effect such as promoting generation of ATP may be provided. The near-infrared light source (NIR) may include a wavelength conversion material or an LED. The intensity of the peak of light generated by the near-infrared light source (NIR) may be 4.5% or more of the intensity of the maximum peak in the blue band (e.g., 420 nm to 465 nm), and may be 7% or more in some example embodiments.

In the present example embodiment, together with first blue light having a peak wavelength of 430 nm to 455 nm (e.g., an LED chip) and second blue light having a peak wavelength of 465 nm to 495 nm (e.g., an LED chip or a wavelength conversion material), by combining first and second wavelength conversion materials configured to emit first light having a peak wavelength of 520 nm to 560 nm (e.g., cyan, green, or yellow) and second light having a peak wavelength of 590 nm to 655 nm, white light having a color rendering index (CRI) of 80 or more while being human-friendly may be provided.

The white light according to the present example embodiment may have a slightly higher color temperature of 4000 K. As described above, since BLH can be reduced, human-friendly white light having a high color temperature of 3000 K or more can be provided by using sufficient blue light. In addition, since the near-infrared light is enhanced, it can contribute to the promotion of generation of ATP.

Referring to FIG. 9, a spectrum W2 of white light in which blue light, which is a melanopic sensitivity bandwidth, is reduced is shown.

By lowering the intensity of the melanopic sensitivity band, especially in a 465 nm to 495 nm band, green and red wavelength conversion materials may be used to maintain a color rendering index of 80% or more while controlling a melanopic photopic ratio of the white light W2 as low as 0.37. In order to implement the white light under these conditions, the green wavelength conversion material may be configured to emit light having a peak wavelength of 535 nm to 550 nm, and the red wavelength conversion material may be configured to emit light having a peak wavelength of 610 nm to 660 nm. In particular, the green wavelength conversion material may emit light having a full width at half maximum (FWHM) of 60 nm or less so as to reduce a region of 465 nm to 495 nm in the spectrum of the final white light. For example, the green wavelength conversion material may include $\beta\text{-Si}_{6-z}Al_zO_zN_{8-z}:Eu^{2+}_z(0.01 \leq z \leq 5.99)$.

As shown in FIG. 9, similar to the previous example embodiment, a near-infrared light source (NIR) having a peak intensity at 740 nm to 900 nm may be added to provide a positive biological effect such as promoting generation of ATP. The near-infrared light source (NIR) may include a wavelength conversion material or an LED. A peak of light generated by the near-infrared light source (NIR) may have an intensity that is 4.5% or more of the maximum peak in the blue band (e.g., 420 nm to 465 nm), and may be 7% or more in some example embodiments.

The white light according to the present example embodiment is illustrated with a color temperature of 2200 K, but may be implemented to have various color temperature ranges. As the color temperature increases, the melanopic photonic ratio may tend to increase. The white light may be implemented to have a relatively low melotonic ratio in a range of 1800K to 4000K. For example, the white light may have a melotonic ratio in a range of 0.1 to 0.65 in the range of 1800K to 4000K.

As described above, while promoting secretion of melatonin hormone, it is possible to provide adequate white light illumination having a high color rendering index, and at the same time, enhance near-infrared light, thereby contributing to the promotion of generation of ATP.

Figure 10:
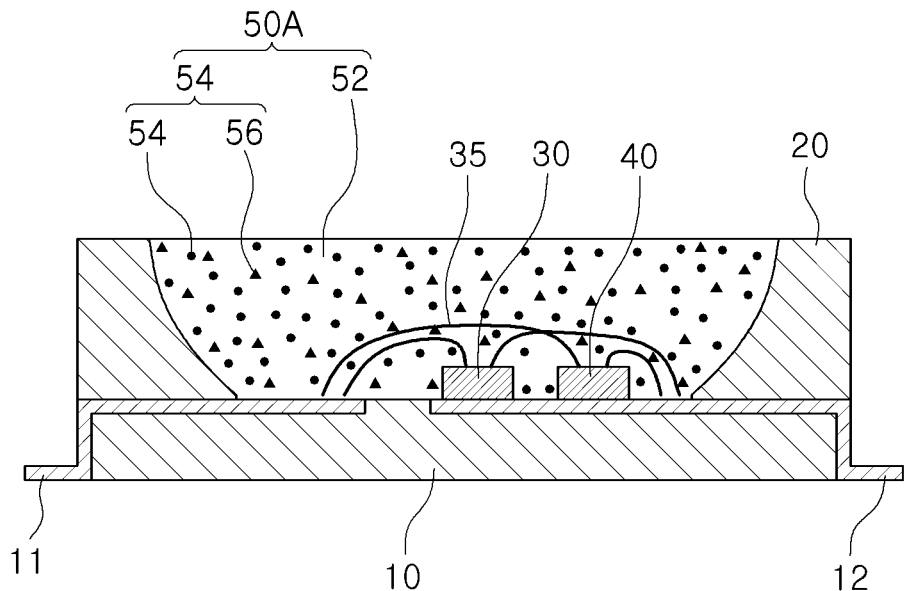
FIG. 10 is a schematic cross-sectional view illustrating an LED module according to an example embodiment of the present disclosure.

The near-infrared light source for photobiomodulation may be combined with a white illumination light source to provide a white illumination apparatus (or a white LED module) with enhanced biological functions. The near-infrared light source may include a near-infrared LED chip in addition to a wavelength conversion material such as a phosphor or quantum dot using an excitation light source. FIG. 10 is a schematic cross-sectional view illustrating an LED module including an additional LED chip for near-infrared light as an example embodiment of the present disclosure.

Referring to FIG. 10, it can be understood that an LED module 100A according to the present embodiment is similar to the LED module shown in FIG. 1 except that an additional LED chip (e.g., near-infrared LED 40) is employed in place of a wavelength conversion material (e.g., wavelength conversion material 58 in FIG. 1) as a near-infrared light source. Description of the components of the present example embodiment may refer to the description of the same or similar components of the LED module 100 shown in FIG. 1 unless otherwise specified.

A wavelength conversion unit 50A employed in the present example embodiment includes a first wavelength conversion material 54 emitting first light having a peak wavelength of 520 nm to 560 nm, a second wavelength conversion material 56 emitting light having a peak wavelength of 600 nm to 650 nm, and a transparent resin 52 in which the first wavelength conversion material 54 and the second wavelength conversion material 56 are dispersed.

The LED module 100A according to the present example embodiment may include a near-infrared LED 40 in addition to the LED 30 (e.g., blue LED). The near-infrared LED 40 may be configured to emit a wavelength in a near-infrared band. Light in the near-infrared band employed in the present example embodiment may have a peak wavelength of 740 nm to 900 nm. In a spectrum of the final white light, the peak intensity at 740 nm to 900 nm may be 4.5% or more of the maximum peak in the blue band (e.g., 420 nm to 465 nm), and may be 7% or more in some example embodiments.

As described above, by reinforcing light in the near-infrared band, it is possible to provide a positive biological effect such as promoting generation of ATP. In the present example embodiment, the near-infrared LED 40 is illustrated as one, but in some example embodiments, a plurality of the near-infrared LED 40 configured to emit light of different peak wavelengths in a range of 740 nm to 900 nm may be provided. For example, in consideration of the ATP action spectrum shown in FIG. 4, the plurality of near-infrared LEDs may include a first LED chip having a peak wavelength of 620 nm to 720 nm, and a second LED having a peak wavelength of 720 nm to 900 nm.

Figure 14:
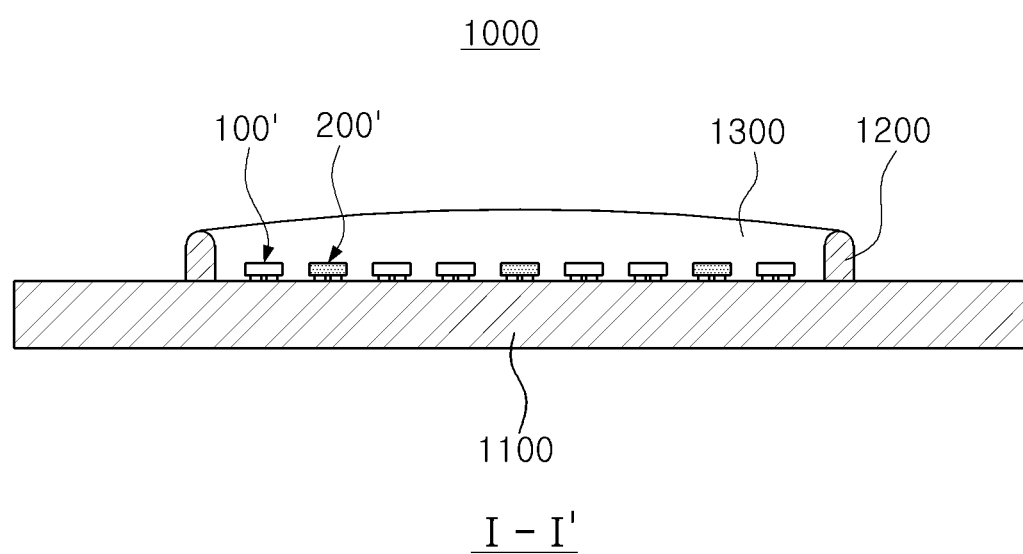
FIG. 14 is a side cross-sectional view of the LED module according to the example embodiment of the present disclosure.

In the present example embodiment, the near-infrared LED 40 is illustrated in a form surrounded by a wavelength conversion unit 50A, together with the LED 30, but in another example embodiment, the near-infrared LED 40 may be disposed separately from the wavelength conversion unit 50A (see FIG. 14).

The LED module (or an lighting apparatus) according to the present example embodiment exemplifies a form in which a near-infrared light source for photobiomodulation is combined with a white illuminance light source, but it can be applied similarly to other colored (blue, green, or red) LED modules including at least one LED chip. Such an LED module is illustrated in FIGS. 11A and 11B.

Figure 11A:
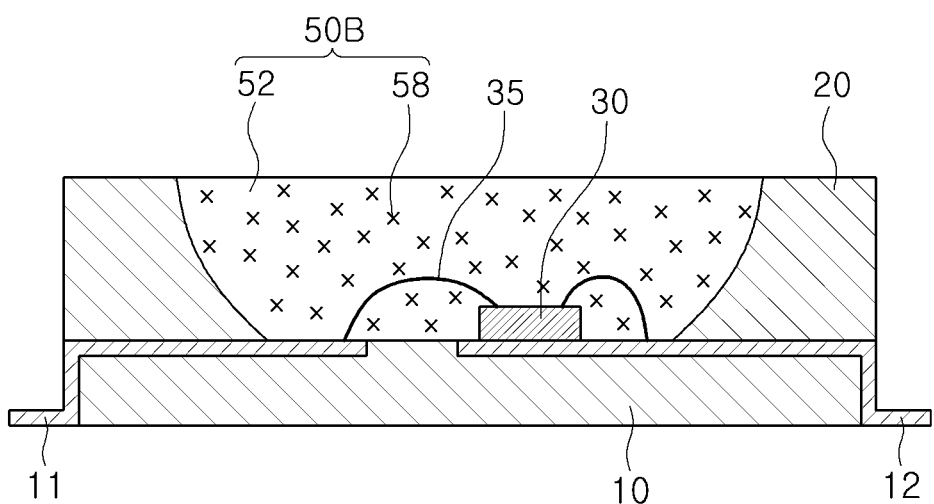
FIG. 11A is a schematic cross-sectional view illustrating an LED module according to an example embodiments of the present disclosure.
Figure 11B:
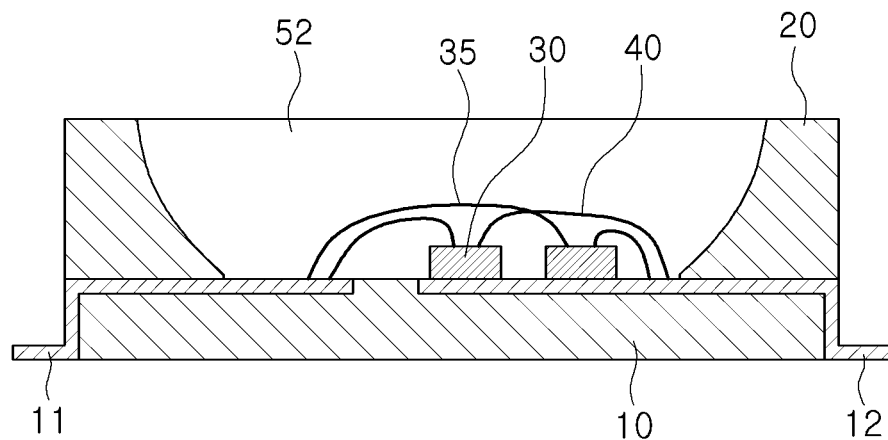
FIG. 11B is a schematic cross-sectional view illustrating an LED module according to an example embodiment of the present disclosure.

Referring to FIG. 11A, an LED module 100B according to the present example embodiment may include a package substrate 10, a light emitting diode (LED) 30 disposed on the package substrate 10, and a wavelength conversion unit 50B comprising a wavelength conversion material. The LED module 100 may further include a pair of lead frames 11 and 12 electrically connected to the LED 30, a side wall reflecting unit 20 having a cup shape, and a conductive wire 33 connecting the LED 30 and the lead frames 11 and 12.

The LED 30 employed in the present example embodiment may include an epitaxial semiconductor layer configured to emit colored light in other visible light wavelength bands in addition to blue light. For example, the LED 30 may be configured to emit blue, yellow, green, orange, or red light.

The wavelength conversion unit 50B may be disposed on an optical path of the LED 30 and may include the wavelength conversion material 58 (a near-infrared wavelength conversion material) dispersed in a transparent resin 52. The wavelength conversion material 58 may be configured to emit light in the near-infrared band. The wavelength conversion material 58 may provide light in the near-infrared band by using the light of the LED 30 as excitation light. The light in the near-infrared band may have a peak wavelength of 740 nm to 900 nm. For example, the wavelength conversion material 58 may include $Ca(Al_{12-x-y},Ga_y)O_{19}:xCr^{3+}$ ($0 \leq x \leq 1$, $0 \leq y \leq 6$), $Lu_3Al_5O_{12}:Ce^{3+},Cr^{3+}$, $La_3MgZrO_6:Cr^{3+}$, $LiInSi_2O_6:Cr^{3+}$, $LiZnSnO:Cr^{3+}$, and $ScBO_3:Cr^{3+}$ or a combination thereof. The wavelength conversion unit 50B may additionally include other wavelength conversion materials according to the desired colored light.

As described above, by reinforcing light in the near-infrared band, it is possible to provide a positive biological effect such as promoting generation of ATP. Specifically, the light in the near-infrared band may be absorbed by cytochrome c oxidase present in cells to promote the generation of ATP, which is a source of energy in cells.

Referring to FIG. 11B, it can be understood that an LED module 100C according to the present example embodiment is similar to the LED module 100B illustrated in FIG. 11A, except that an additional LED chip (e.g., near-infrared LED 40) is employed in place of a near-infrared wavelength conversion material (e.g., wavelength conversion material 58 in FIG. 11A) as a near-infrared light source. For a description of the components of the present example embodiment, unless otherwise specified, a description of the same or similar components of the LED module 100B shown in FIG. 11A may be referred to.

The LED module 100C according to the present example embodiment may include a near-infrared LED 40 in addition to the other colored LEDs (e.g., LED 30). The near-infrared LED 40 may be configured to emit a wavelength in the near-infrared band as described above. Light in the near-infrared band employed in the present example embodiment may have a peak wavelength of 740 nm to 900 nm. In the spectrum of the final white light, the peak intensity at 740 nm to 900 nm may be 4.5% or more of the maximum peak in the blue band (e.g., 420 nm to 465 nm), and may be 7% or more in some example embodiments.

As described above, by reinforcing light in the near-infrared band, it is possible to provide a positive biological effect such as promoting generation of ATP.

The LED module (or a lighting apparatus) according to the present example embodiment may be implemented in a form capable of selectively performing a biological function. For example, the first LED light source unit may be provided as a basic light source of, for example, white light, and the second LED light source unit may be provided as an LED module (or a lighting apparatus) provided as a near-infrared light source to perform an ATP generation promotion function in a specific environment.

Figure 12:
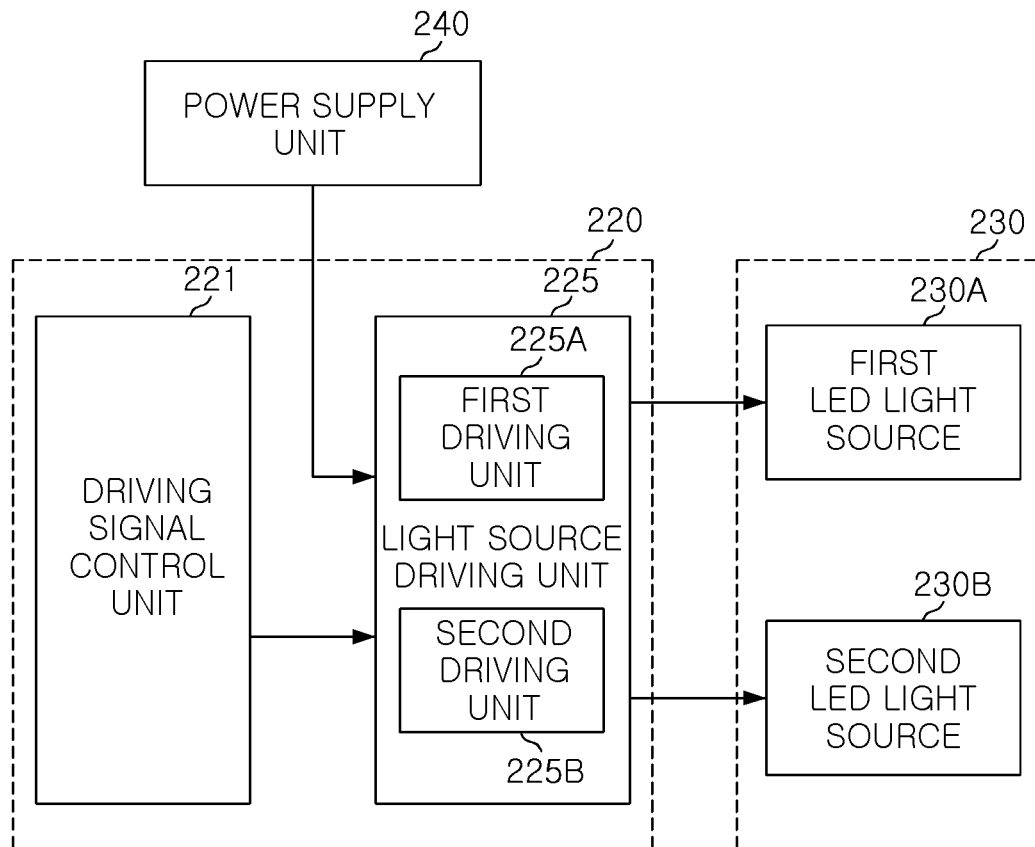
FIG. 12 is a block diagram of an LED lighting apparatus according to an example embodiment of the present disclosure.

FIG. 12 is a block diagram of an LED lighting apparatus according to an example embodiment of the present disclosure.

Referring to FIG. 12, an LED lighting apparatus 200 according to the present example embodiment may include a driving control unit 220 (e.g. a driving controller), a light source unit 230, and a power supply unit 240. The light source unit 230, or the driving control unit 220 and the light source unit 230, may be configured as one module.

A first LED light source 230A may be provided as a basic light source that provides, for example, white lighting (e.g., refer to spectrum W1 in FIG. 8 or spectrum W2 in FIG. 9), and a second LED light source 230B may be composed of an LED provided as a near-infrared light source to perform an ATP generation promotion function in a specific environment. The LED constituting the second LED light source 230B may provide near-infrared light of 740 nm to 900 nm.

The power supply unit 240 may supply AC or DC power to a light source driving unit 225 of the driving control unit 220. The driving control unit 220 may include the light source driving unit 225 and a driving signal control unit 221 providing a driving signal for controlling the light source driving unit 225. The light source driving unit 225 may be connected to the power supply unit 240 to receive power, and may supply a current controlled by a driving signal of the driving signal control unit 221 to a first LED light source 230A and a second LED light source 230B of the light source unit 230. In the present example embodiment, the light source driving unit 225 may be controlled with different currents independently of the first LED light source 230A and the second LED light source 230B.

In some example embodiments, the driving control unit 220 may further include a communication module transmitting and receiving data having color characteristics such as a color temperature measured inside or outside the LED lighting apparatus 200. The driving control unit 220 may further include a signal processing unit processing data from at least one of an illuminance sensor, a motion sensor, and an image sensor to transmit/receive to the inside or outside of the LED lighting apparatus 200.

According to embodiments, the driving control unit 220 may be implemented as a controller comprising at least one processor and memory storing computer instructions. The computer instructions, when executed by the at least one processor, may be configured to cause the driving control unit 220 to perform any number of its functions described in the present disclosure.

Figure 13:
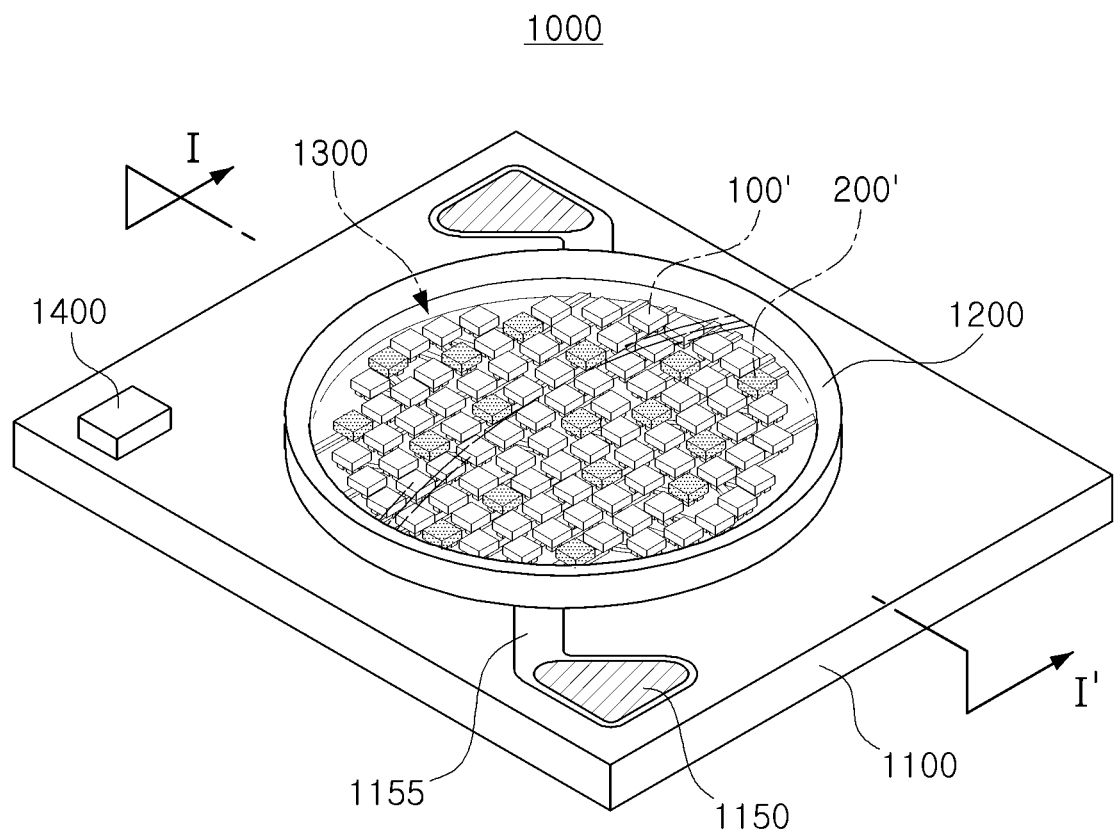
FIG. 13 is a perspective view of an LED module according to an example embodiment of the present disclosure.
Figure 15:
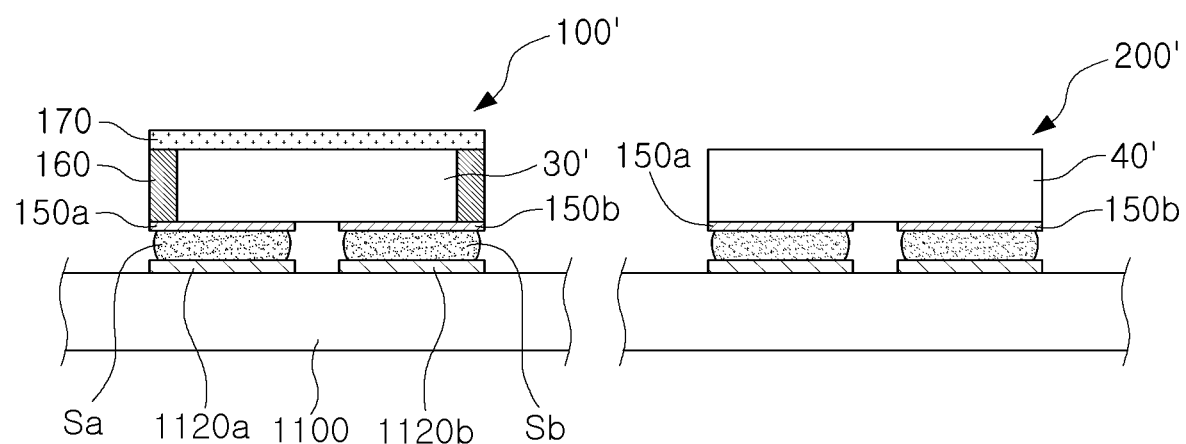
FIG. 15 is a side cross-sectional view illustrating an example of a white light emitting apparatus that can be employed in the LED light emitting module of FIG. 13.

In the present example embodiment, referring to FIGS. 13-15, the first LED light source 230A may include a white LED (e.g. an LED source 100') and a near-infrared LED (e.g., an LED light source 200') according to embodiments of the present disclosure, and in a specific environment or user's selection, the applied current of the near-infrared LED may be appropriately adjusted in order to adjust a biological function through the light source driving unit 225.

FIGS. 13 and 14 are perspective and side cross-sectional views of an LED light-emitting module (or a lighting apparatus) according to an example embodiment of the present disclosure, respectively. FIG. 15 is a side cross-sectional view illustrating an example of LED light source 100' and a second LED light source 200' that can be employed in the LED light emitting module (a lighting apparatus) of FIG. 13.

Referring to FIGS. 13 and 14, a light source module 1000 according to an example embodiment of the present disclosure may include a substrate (e.g., a circuit board 1100), a first LED light source 100' and a second LED light source 200' mounted on the circuit board 1100, a dam 1200 surrounding the first LED light source 100' and the second LED light source 200', an encapsulation unit 1300 covering the first LED light source 100' and the second LED light source 200', and a driving control chip 1400. Each of the first LED light source 100' and the second LED light source 200' may include a plurality of first and second white light emitting apparatuses previously described in example embodiments. In addition, the driving control unit 220 illustrated in FIG. 12 may be implemented as the driving control chip 1400.

The circuit board 1100 may include a conductive and insulating material, and a metal pattern 1155 connected to the first LED light source 100' and the second LED light source 200' and a terminal unit 1150 connected to a metal pattern 1155 may be disposed on an upper surface thereof.

The circuit board 1100 may be, for example, an FR4 type printed circuit board (PCB), and may include an organic resin containing epoxy, triazine, silicon, polyimide, and the like, or a ceramic such as SiN, AlN, Al$_2$O$_3$, or the like, or a metal and a metal compound. The circuit board 1100 may include a PCB, MCPCB, MPCB, FPCB, CCL, MCCL, or the like.

The metal pattern 1155 may be electrically connected to the first LED light source 100' and the second LED light source 200', and may be electrically connected to an external power source through the terminal unit 1150, so that an electrical signal may be applied to the first LED light source 100' and the second LED light source 200'. The metal pattern 1155 and the terminal unit 1150 may have a form of a conductive thin film, and may be formed of, for example, a copper foil.

Each of the plurality of the first LED light source 100' and the second LED light source 200' may be disposed on the circuit board 1100, respectively. The first LED light source 100' and the second LED light source 200' may include an LED chip (e.g., blue LED chip 30' in FIG. 15) having a first conductivity-type semiconductor layer and a second conductivity-type semiconductor layer and an active layer disposed therebetween. The first LED light source 100' may be provided as a basic light source of, for example, white lighting, and the second LED light source 200' may be composed of an LED provided as a near-infrared light source to perform an ATP generation promotion function in a specific environment. The LED constituting the second LED light source 200' may provide near-infrared light of 740 nm to 900 nm. The first LED light source 100' and the second LED light source 200" are illustrated in FIG. 15.

Referring to FIG. 15, the first LED light source 100' employed in the present example embodiment has a chip scale package form, and the second LED light source 200' is illustrated as a near-infrared LED chip. The near-infrared LED chip may also be implemented as a GaAs-based semiconductor epitaxial.

Referring to FIG. 15, the plurality of the first LED light source 100' according to the present example embodiment may include a blue LED chip 30' emitting blue light, a first electrode 150*a* and a second electrode 150*b* disposed on a lower surface of the blue LED chip 30', a reflective layer 160 surrounding a side surface of the blue LED chip 30', and a wavelength conversion unit 170 disposed on an upper surface of the blue LED chip 30'.

The first electrode 150*a* and the second electrode 150*b* may be made of a conductive material, and may be electrically connected to a first electrode pattern 1120*a* and a second electrode pattern 1120*b* of the circuit board 1100 through a first bump Sa and a second bump Sb, respectively. The reflective layer 160 may reflect light emitted from the blue LED chip 30' to the side surface to be directed upwardly. The reflective layer 160 may include a light reflective material, and may include, for example, white powder such as SiO$_2$, TiO$_2$, or Al$_2$O$_3$. The wavelength conversion unit 170 may include first and second wavelength conversion materials for converting a part of blue light emitted from the blue LED chip 30' into another wavelength.

The second LED light source 200' may include a plurality of near-infrared LED chips 40' configured to emit light having different peak wavelengths in a range of 740 nm to 900 nm in near-infrared rays. For example, in consideration of the ATP action spectrum shown in FIG. 4, the plurality of near-infrared LED chips 40' may include a first LED chip having a peak wavelength of 620 nm to 720 nm and a second LED chip having a peak wavelength of 720 nm to 900 nm.

The dam 1200 may be disposed so as to surround the first LED light source sources 100' and the second LED light source 200' on the circuit board 1100 to define an internal light emitting region. The dam 1200 may be disposed to protrude above the upper surface of the circuit board 1100, and may have a ring shape. However, the shapes of the circuit board 1100 and the dam 1200 in the present example embodiment is not limited to a square and a circular shape, respectively, and accordingly, the disposition of the first LED light source 100' and the second LED light source 200' may be variously changed. In addition, in some example embodiments, the dam 1200 may also be omitted.

The encapsulation unit 1300 may fill an interior of the space partitioned by the dam 1200, and may cover the first LED light source 100' and the second LED light source 200'. The encapsulation unit 1300 may be formed in a dome shape, which is convex upwardly, to adjust a directivity angle of light emitted externally, but is not limited thereto. The encapsulation unit 1300 may be made of a light transmitting material so that light generated from the first LED light source 100' and the second LED light source 200' can be emitted externally. As the light transmitting material, for example, a resin such as silicon, epoxy, or the like, may be used. The encapsulation unit 1300 may be formed by injecting a resin onto the circuit board 1100 and curing it by heating, irradiating light, or elapsed time. In some example embodiments, the encapsulation unit 1300 may include a light reflective material to diffuse light emitted externally. As the light reflective material, for example, white powder such as SiO$_2$, TiO$_2$, or Al$_2$O$_3$ may be used. However, in some example embodiments, the encapsulation unit 1300 may also be omitted, and each of the first LED light source 100' and the second LED light source 200' may also include a lens.

Figure 16:
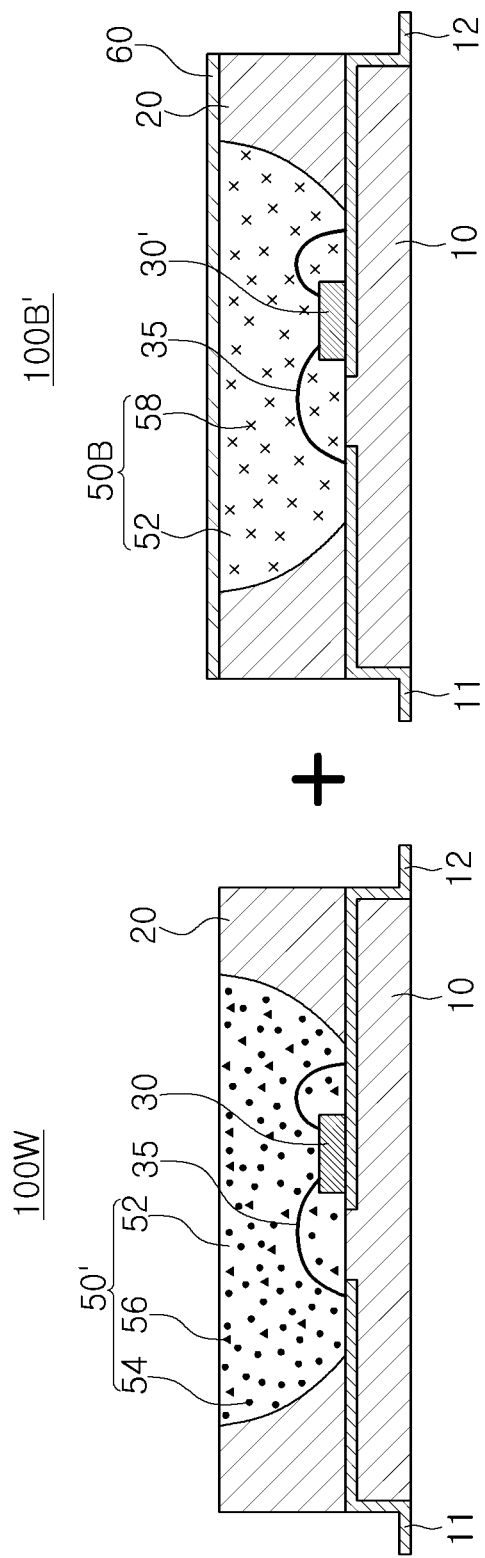
FIG. 16 is a side cross-sectional view illustrating first and second LED packages that can be employed in the LED module according to an example embodiment of the present disclosure.

FIG. 16 is a cross-sectional side view illustrating first and second LED packages that can be employed in the LED light emitting module according to an example embodiment of the present disclosure.

An LED light emitting module according to the present example embodiment may include a first LED package 100W configured to emit white light, and a second LED package 100B' configured to emit light having a peak wavelength of 740 nm to 900 nm. For example, in the light source module 1000 according to the previous example embodiment, the first LED light source 100' may be replaced with the first LED package 100W, and the second LED light source 200' may be replaced with the second LED package 100B'.

The first LED package 100W may be understood as a light source in which a wavelength conversion material 58 for near-infrared light is omitted from the LED module 100 shown in FIG. 1. For a detailed description of each component of the first LED package 100W, the description of the LED module 100 shown in FIG. 1 can be referred to.

The first LED package 100W employed in the present example embodiment may include a first (i.e., blue light) emitting diode (e.g. LED 30) mounted on a package substrate 10 and configured to emit blue light having a peak wavelength of 420 nm to 465 nm, and a wavelength conversion unit 50' having a first wavelength conversion material 54 and a second wavelength conversion material 56 excited by the blue light to convert them into green light and red light, respectively. The unconverted blue light and the converted green light and red light may be combined to emit final white light. In some example embodiments, the wavelength conversion material introduced into the wavelength conversion unit 50' may include one wavelength conversion material (e.g., yellow) or three or more wavelength conversion materials (e.g., an orange wavelength conversion material added).

The second LED package 100B' may be understood as a light source that further includes a wavelength selection filter unit 60 (e.g., a wavelength selection filter) in the LED module 100B shown in FIG. 11A. For a detailed description of each component of the second LED package 100B', a detailed description of the LED module 100B illustrated in FIG. 11A may be referred to.

The second LED package 100B' employed in this embodiment may include a second LED (e.g. a blue LED chip 30') mounted on the package substrate 10 and configured to emit light of a specific wavelength, a wavelength conversion unit 50B having a near-infrared wavelength conversion material (e.g., the wavelength conversion material 58) excited by light of a specific wavelength and emitting near-infrared light having a peak wavelength of 740 nm to 900 nm, and a wavelength selection filter unit 60 disposed on the wavelength conversion unit 50B.

The second LED may be a blue light emitting diode configured to emit blue light having a peak wavelength of 420 nm to 465 nm. In some example embodiments, the second LED may be the same blue light emitting diode as the LED 30 of the first LED package 100W. The wavelength selection filter unit 60 may be configured to block the unconverted specific light (e.g., blue light) and transmit the near-infrared light. For example, the wavelength selection filter unit 60 may have a structure in which two kinds of dielectric layers having different refractive indices are alternately stacked.

The wavelength conversion material 58 may include $Ca(Al_{12-x-y}Ga_y)O_{19}:xCr^{3+}$ ($0 \leq x \leq 1$, $0 \leq y \leq 6$). It is not limited thereto, and the wavelength conversion material 58 may include at least one phosphor selected from a group consisting of $Lu_3Al_5O_{12}:Ce^{3+},Cr^{3+}$, $La_3MgZrO_6:Cr^{3+}$, $LiInSi_2O_6:Cr^{3+}$, $LiZnSnO:Cr^{3+}$, and $ScBO_3:Cr^{3+}$.

In some example embodiments, the second LED package 100B' may be used as a functional light source to promote ATP generation. The second LED package 100B' may not be combined with an LED light source emitting basic illumination light (e.g., a white light LED module or colored light LED module like the first LED package 100W), and may be used alone and be provided as a near-ultraviolet light LED module.

Figure 17:
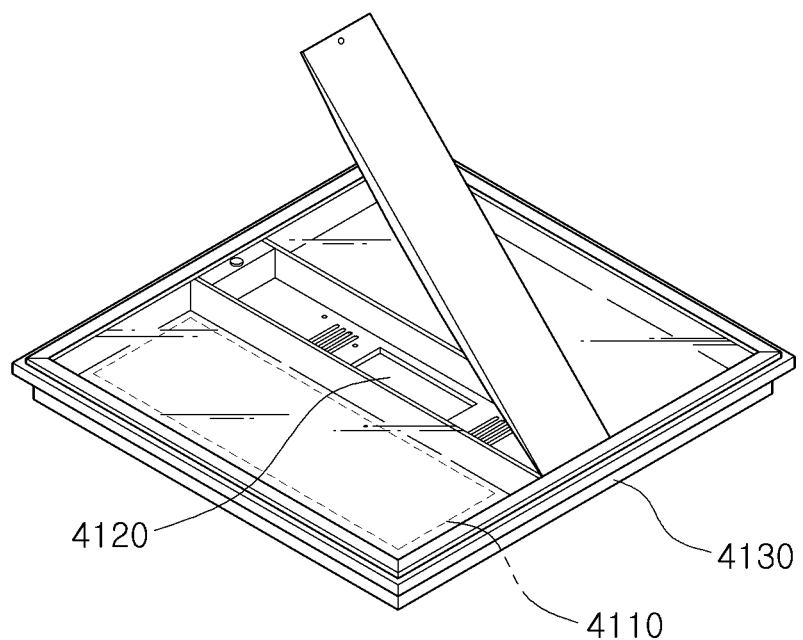
FIG. 17 is a schematic perspective view of a flat panel lighting apparatus according to an example embodiment of the present disclosure.
Figure 18:
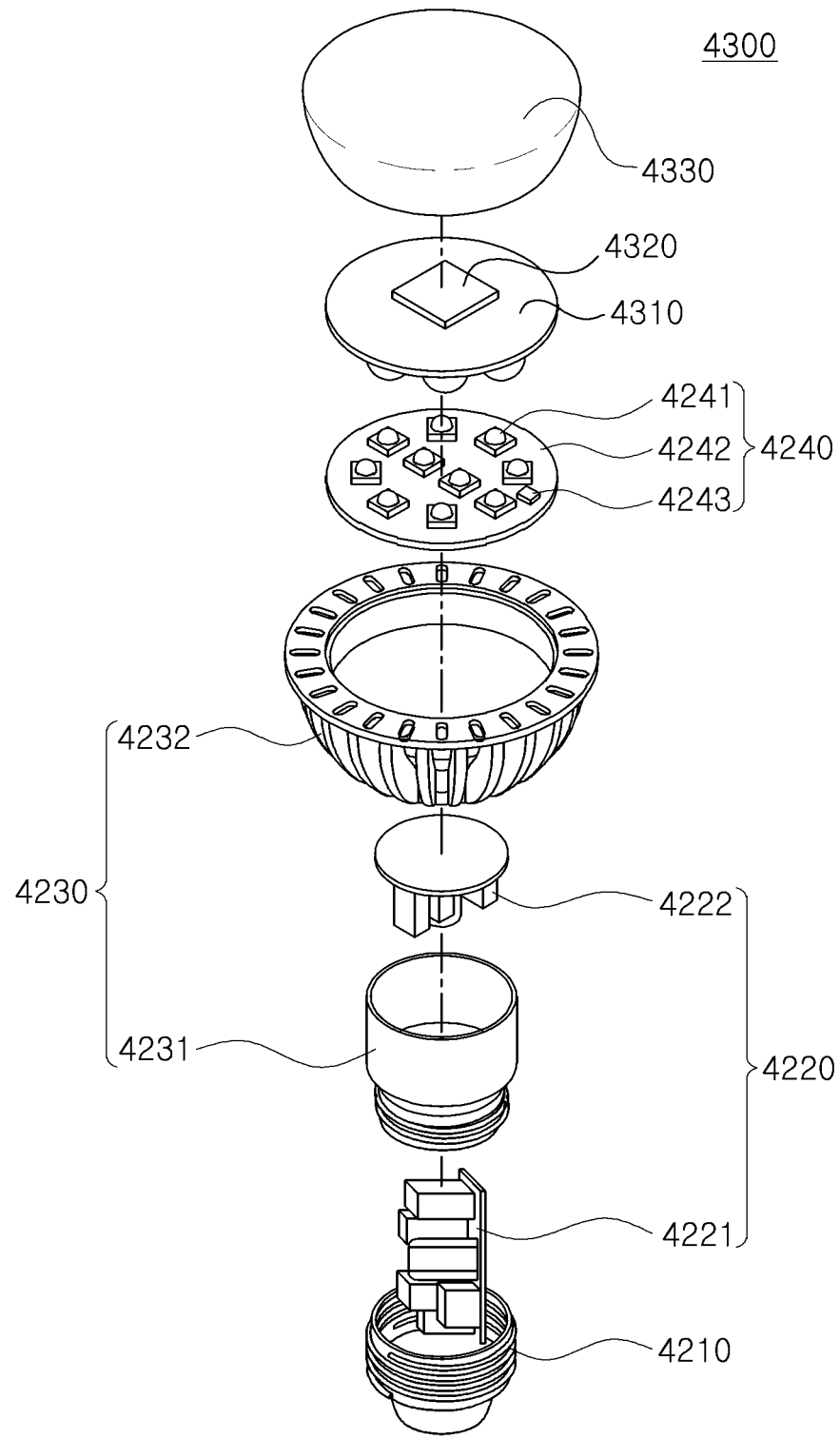
FIG. 18 is an exploded perspective view illustrating a bulb type lighting apparatus according to an example embodiment of the present disclosure.

FIG. 17 is a perspective view schematically showing a flat-panel lighting apparatus according to an example embodiment of the present disclosure, and FIG. 18 is an exploded perspective view illustrating a bulb-type lighting apparatus according to an example embodiment of the present disclosure.

Referring to FIG. 17, a flat lighting apparatus 4100 may include a light source module 4110, a power supply device 4120, and a housing 4130. The power supply device 4120 may include a driving control unit (e.g., driving control unit 220 of FIG. 12).

The light source module 4110 may include a light source array, and may be formed to achieve a planar phenomenon as a whole. The light source(s) constituting the light source module 4110 may be configured to include, for example, the LED module shown in FIGS. 1, 10, 11A and 11B, and FIG. 16, or the light source module 4110 may be implemented with the light source module 1000 (e.g., LED module) shown in FIG. 13.

The power supply device 4120 may be configured to supply power to the light source module 4110. The housing 4130 may have an accommodation space formed to accommodate the light source module 4110 and the power supply device 4120 therein, and may be formed in a hexahedral shape open on one side, but is not limited thereto. The light source module 4110 may be disposed to emit light through an open side of the housing 4130. Unlike the present example embodiment, at least a portion of phosphors of the wavelength conversion materials employed in the white light emitting apparatus may be disposed on other components (e.g., a light guide plate, a diffusion plate, and a lens) of the flat lighting apparatus 4100 other than the white light emitting apparatus.

FIG. 18 is an exploded perspective view illustrating a bulb type lighting apparatus according to an example embodiment of the present disclosure.

Referring to FIG. 18, a bulb type lighting apparatus 4300 may include a socket 4210, a power supply unit 4220, a heat dissipation unit 4230, a light source module 4240, and an optical unit 4330.

The socket 4210 may be configured to be replaceable with an existing lighting apparatus. Power supplied to the bulb type lighting apparatus 4300 may be applied through the socket 4210. As illustrated, the power supply unit 4220 may be separated and assembled into a first power supply unit 4221 and a second power supply unit 4222. The heat dissipation unit 4230 may include an internal heat dissipation unit 4231 and an external heat dissipation unit 4232, and the internal heat dissipation unit 4231 may be directly connected to the light source module 4240 and/or the power supply unit 4220, thereby, heat may be transferred to the external heat dissipation unit 4232. The optical unit 4330 may be lens-shaped and may be configured to evenly distribute light emitted by the light source module 4240.

The light source module 4240 may receive power from the power supply unit 4220 and emit light to the optical unit 4330. The light source module 4240 may include one or more light sources 4241, a circuit board 4242, and a controller 4243, and the controller 4243 may store driving information of the one or more light sources 4241. The one or more light sources 4241 constituting the light source module 4240 may be configured to include, for example, the LED module shown in FIGS. 1, 10, 11A and 11B, and FIG. 16, or the light source module 4240 may be implemented with the light source module 1000 (e.g., LED module) shown in FIG. 13.

In the bulb type lighting apparatus 4300 according to the present embodiment, a reflecting unit 4310 may be included above the light source module 4240, and the reflecting unit 4310 may reduce glare by evenly spreading light from the light source module 4240 to the side and rear sides.

A communication module 4320 may be mounted above the reflecting unit 4310, and home-network communication may be implemented through the communication module 4320. For example, the communication module 4320 may be a wireless communication module using Zigbee®, Wi-Fi, or Li-Fi, and on/off of a lighting apparatus through a smartphone or a wireless controller, and may control lighting installed inside and outside the home, such as on/off of a lighting apparatus and control of brightness through a smartphone or a wireless controller. In addition, the Li-Fi communication module using the visible light wavelength of the lighting apparatus installed inside and outside the home may be used to control electronic products and vehicle systems inside and outside the home such as TVs, refrigerators, air conditioners, door locks, and automobiles. The reflecting unit 4310 and the communication module 4320 may be covered by the optical unit 4330 that may be lens-shaped.

As set forth above, according to an example embodiment of the present disclosure, by combining a near-infrared light source having an ATP action spectrum (e.g., a peak wavelength of 740 nm to 900 nm) with a basic illumination light source (e.g., white or colored illumination light), an LED module and a lighting apparatus having a biological energy enhancement function may be provided.

While example embodiments have been shown and described above, it will be apparent to those skilled in the art that modifications and variations could be made without departing from the scope of the present disclosure.

What is claimed is:

1. A light emitting diode (LED) module comprising:
   a blue light emitting diode configured to emit blue light having a first peak wavelength of 420 nm to 465 nm; and
   a near-infrared wavelength conversion material that is configured to be excited by the blue light to emit additional light having a peak wavelength in a range of 740 nm to 900 nm, and further having a full width at half maximum (FWHM) of 120 nm or less,
   wherein the near-infrared wavelength conversion material comprises $Ca(Al_{12-x-y},Ga_y)O_{19}:xCr^{3+}$ ($0 \leq x \leq 1$, $0 \leq y \leq 6$), and
   wherein, in a spectrum of light emitted from the LED module, the light has a peak intensity in the range of 740 nm to 900 nm, and the peak intensity is greater than or equal to 4.5% of a peak intensity of the blue light.

2. The LED module of claim 1, wherein in a spectrum of light emitted from the LED module, an integrated light amount of a visible light wavelength band of 700 nm or less is 20% or less of an integrated light amount of an entirety of the spectrum.

3. The LED module of claim 1, wherein in a spectrum of light emitted from the LED module, wherein an integrated light amount of a visible light wavelength band of 700 nm or less is 10% or less of an integrated light amount of an entirety of the spectrum.

4. The LED module of claim 1, wherein the peak wavelength of the near-infrared wavelength conversion material is in a range of 750 nm to 850 nm.

5. The LED module of claim 1, wherein the near-infrared wavelength conversion material further comprises at least one phosphor selected from a group consisting of $Lu_3Al_5O_{12}:Ce^{3+}$, $Cr^{3+}$, $La_3MgZrO_6:Cr^{3+}$, $LiInSi_2O_6:Cr^{3+}$, $LiZnSnO:Cr^{3+}$, and $ScBO_3:Cr^{3+}$.

6. The LED module of claim 1, further comprising a colored light source configured to emit colored light in a visible light wavelength band.

7. The LED module of claim 6, wherein the colored light source comprises a first wavelength conversion material that is configured to be excited by the blue light to emit green light having a peak wavelength in a range of 520 nm to 560 nm.

8. The LED module of claim 7, wherein the first wavelength conversion material comprises at least one phosphor selected from a group consisting of $(Ga,Gd,Y,Lu)_3Al_5O_{12}:Ce^{3+}$, $La_3Si_6N_{11}:Ce^{3+}$, $(Sr,Ca,Ba)Si_2O_2N_2:Eu^{2+}$, $(Sr,Ba)_2SiO_4:Eu^{2+}$, and β-SiAlON:$Eu^{2+}$.

9. The LED module of claim 6, wherein the colored light source comprises a second wavelength conversion material that is configured to be excited by the blue light to emit red light having a peak wavelength in a range of 600 nm to 650 nm.

10. The LED module of claim 9, wherein the second wavelength conversion material comprises at least one phosphor selected from a group consisting of $(Sr,Ca)AlSiN_3:Eu^{2+}$, $CaAlSiN_3:Eu^{2+}$, and $K_xSiF_y:Mn^{4+}$ ($2 \leq x \leq 3$, $4 \leq y \leq 7$).

11. The LED module of claim 6, wherein the colored light source comprises an LED configured to emit blue, yellow, green, orange, or red light.

12. A light emitting diode (LED) module comprising:
   a blue light emitting diode configured to emit blue light having a first peak wavelength of 420 nm to 465 nm;
   at least one wavelength conversion material that is configured to convert a portion of the blue light into first light having a second peak wavelength in a visible light wavelength band; and
   a near-infrared wavelength conversion material that is configured to be excited by the blue light to emit second light having a third peak wavelength in a range of 740 nm to 900 nm, and further having a full width at half maximum (FWHM) of 120 nm or less,
   wherein the near-infrared wavelength conversion material comprises $Ca(Al_{12-x-y},Ga_y)O_{19}:xCr^{3+}$ ($0 \leq x \leq 1$, $0 \leq y \leq 6$), and
   wherein the first light, second light, and another portion of the blue light combine to form colored light in the visible light wavelength band, and
   wherein, in a spectrum of the colored light, the colored light has a peak intensity in the range of 740 nm to 900 nm, and the peak intensity is greater than or equal to 4.5% of a peak intensity of the blue light.

13. The LED module of claim 12, wherein the at least one wavelength conversion material comprises at least one from among a phosphor and a quantum dot.

14. The LED module of claim 12, wherein the at least one wavelength conversion material comprises a first wavelength conversion material that is configured to be excited by the blue light to emit the first light having a peak wavelength in a range of 520 nm to 560 nm.

15. The LED module of claim 12, wherein the at least one wavelength conversion material comprises a second wavelength conversion material that is configured to be excited by the blue light to emit second light having a peak wavelength in a range of 600 nm to 650 nm.

16. A light emitting diode (LED) module comprising:
   a blue light emitting diode configured to emit blue light having a first peak wavelength of 420 nm to 465 nm; and
   a near-infrared wavelength conversion material that is configured to be excited by the blue light to emit additional light having a peak wavelength in a range of 740 nm to 900 nm, and further having a full width at half maximum (FWHM) of 120 nm or less,
   wherein in a spectrum of light emitted from the LED module, wherein an integrated light amount of a visible light wavelength band of 700 nm or less is 20% or less of an integrated light amount of an entirety of the spectrum,
   wherein the near-infrared wavelength conversion material comprises at least one phosphor selected from a group consisting of $Ca(Al_{12-x-y},Ga_y)O_{19}:xCr^{3+}$ ($0 \leq x \leq 1$, $0 \leq y \leq 6$), $Lu_3Al_5O_{12}:Ce^{3+}$, $Cr^{3+}$, $La_3MgZrO_6:Cr^{3+}$, $LiInSi_2O_6:Cr^{3+}$, $LiZnSnO:Cr^{3+}$, and $ScBO_3:Cr^{3+}$, and
   wherein, in the spectrum of the light emitted from the LED module, the light has a peak intensity in the range of 740 nm to 900 nm, and the peak intensity is greater than or equal to 4.5% of a peak intensity of the blue light.

17. The LED module of claim 16, wherein the peak wavelength of the near-infrared wavelength conversion material is in a range of 750 nm to 850 nm.

18. The LED module of claim 16, wherein the full width at half maximum (FWHM) of the near-infrared wavelength conversion material is 100 nm or less.

19. The LED module of claim 16, wherein the near-infrared wavelength conversion material further comprises $Ca(Al_{12-x-y},Ga_y)O_{19}:xCr^{3+}$ ($0 \leq x \leq 1$, $0 \leq y \leq 6$).

* * * * *